United States Patent [19]
Umezawa et al.

[11] Patent Number: 6,034,567
[45] Date of Patent: Mar. 7, 2000

[54] SEMICONDUCTOR INTEGRATED CIRCUIT DEVICE PROVIDED WITH A DIFFERENTIAL AMPLIFIER

[75] Inventors: Akira Umezawa; Shigeru Atsumi, both of Yokohama; Norihisa Arai, Omiya; Hironori Banba, Kamakura; Ryo Sudo, Yokohama, all of Japan

[73] Assignee: Kabushiki Kaisha Toshiba, Kawasaki, Japan

[21] Appl. No.: 09/030,776

[22] Filed: Feb. 26, 1998

[30] Foreign Application Priority Data

Feb. 27, 1997 [JP] Japan .................................. 9-044242
Feb. 4, 1998 [JP] Japan .................................. 10-023170

[51] Int. Cl.⁷ ................................ H03F 3/45; H03F 3/14
[52] U.S. Cl. ......................... 330/253; 330/261; 330/307
[58] Field of Search .................................. 330/253, 257, 330/261, 307

[56] References Cited

U.S. PATENT DOCUMENTS 4,458,212  7/1984  Brehmer et al. ...................... 330/261
4,524,328  6/1985  Abou et al. .......................... 330/253
4,893,092  1/1990  Okamoto ............................. 330/253
5,789,980  8/1998  Nagata et al. ....................... 330/253
5,812,022  9/1998  Hirano et al. ....................... 330/257

Primary Examiner—Robert Pascal
Assistant Examiner—Patricia T. Nguyen
Attorney, Agent, or Firm—Banner & Witcoff, Ltd.

[57] ABSTRACT

A differential amplifier comprises an n-channel MOS transistor to the gate of which an input voltage VIN1 is fed, and an n-channel MOS transistor to the gate of which an input voltage VIN2 is fed. A p-channel MOS transistor arranged in such a manner that, to the source thereof, a power source voltage Vcc is fed, and the gate and drain thereof are connected to the drain of the MOS transistor, and a p-channel MOS transistor arranged in such a manner that the gate thereof is connected to the drain of the MOS transistor, the drain thereof is connected to the drain of the MOS transistor, and the voltage at this drain is outputted as an output voltage VOUT, and the output current I of a constant-current source is set so that the transistors constituting a differential amplifier may operate in a weak inversion zone.

28 Claims, 11 Drawing Sheets

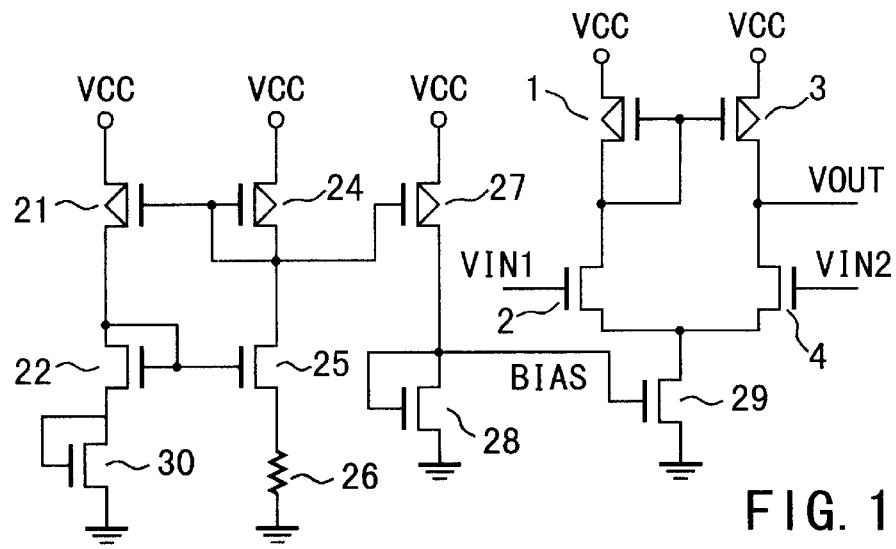
F I G. 13
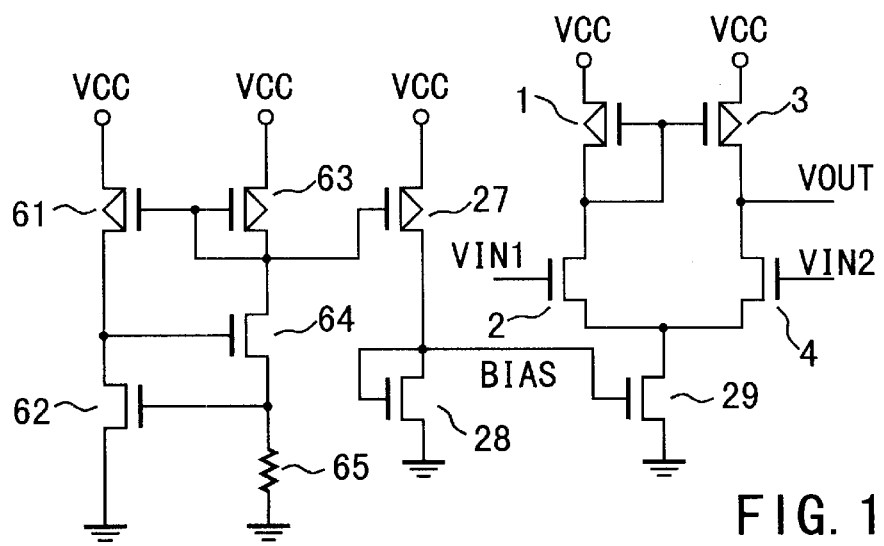
F I G. 14
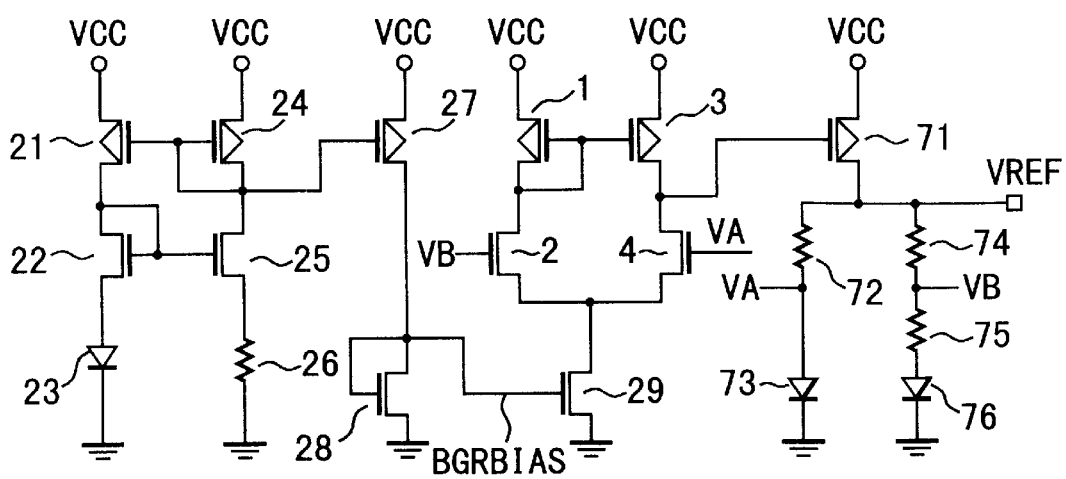
F I G. 15

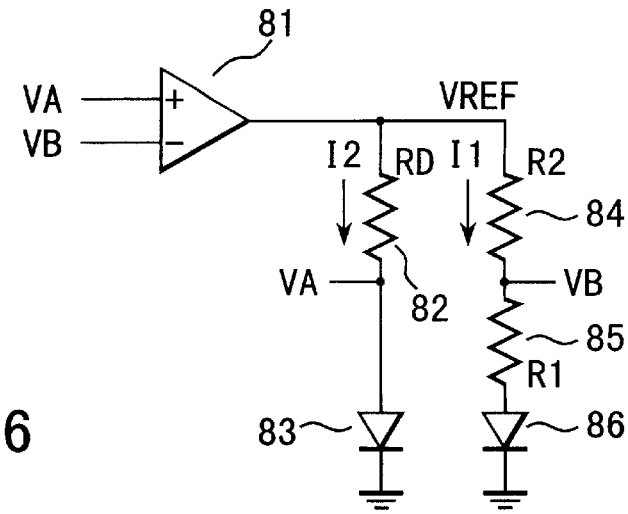
F I G. 16
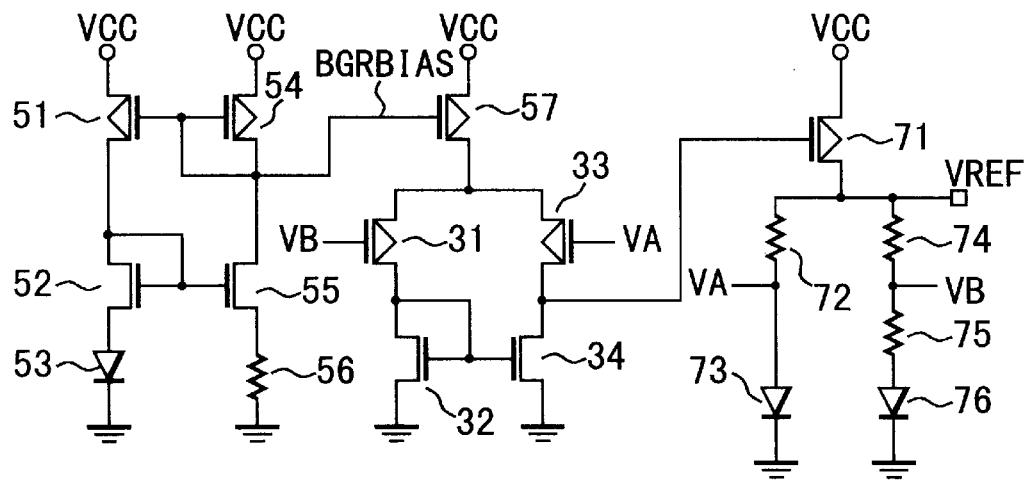
F I G. 17
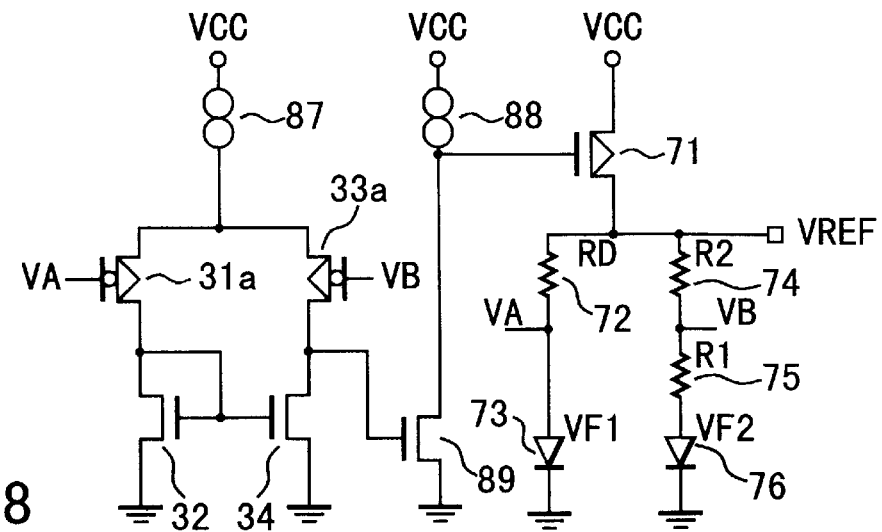
F I G. 18

SEMICONDUCTOR INTEGRATED CIRCUIT DEVICE PROVIDED WITH A DIFFERENTIAL AMPLIFIER

BACKGROUND OF THE INVENTION

The present invention relates to a differential amplifier suited for reduction of the power source voltage and the power consumption and to a semiconductor integrated circuit provided with the differential amplifier.

The operation of a conventional differential amplifier will be briefly described below.

FIG. 1 shows an exemplary conventional differential amplifier using a current mirror circuit. The differential amplifier is comprised of n-channel MOS transistors MN1, MN2 and p-channel MOS transistors MP1, MP2. A first input voltage VIN1 is fed to the gate of the transistor MN1, and the source of the transistor MN1 is grounded. The drain of the transistor MN1 is connected to the drain of the transistor MP1, the gate of the transistor MP1 and the gate of the transistor MP2. The potential at this node N1 is designated as VN1. Fed to the sources of the transistor MP1 and the transistor MP2 are for instance the power source voltage. A second input voltage VIN2 is fed to the gate of the transistor MN2, and the source of the transistor MN2 is grounded. The node between the drain of the transistor MP2 and the drain of the transistor MN2 is used as an output terminal, from which an output voltage VOUT is outputted.

The differential amplifier detects the potential difference between the input voltage VIN1 and the input voltage VIN2 and outputs the output voltage VOUT corresponding to the thus detected potential difference.

For instance, in case the voltage VIN1 is higher than the voltage VIN2, the driving ability of the transistor MN1 becomes greater than the driving ability of the transistor MN2. As a result, the potential VN1 becomes lower than the output voltage VOUT. The output voltage VOUT in this case is designated as VOUTL.

Further, in case the voltage VIN1 is lower than the voltage VIN2, the potential VN1 becomes higher than the output voltage VOUT. The output voltage VOUT in this case is designated as VOUTH.

Further, the amplification degree A of this differential amplifier is defined by the following equation:

$$A=|VOUTH-VOUTL|/|VIN1-VIN2|$$

Here, examination is to be made on the Vg (gate voltage)–Id (drain current) characteristic of an n-channel MOS transistor.

FIG. 2 shows the Vg-Id characteristic of an n-channel MOS transistor. The operating range of the transistor can be divided into a strong inversion zone in which the gate voltage Vg is higher than the threshold voltage VT and a weak inversion zone in which the gate voltage Vg is lower than the threshold voltage VT. The amount of variation of the drain current Id with respect to the gate voltage Vg in the strong inversion zone is smaller than that in the weak inversion zone.

In the case of a conventional differential amplifier, the transistors are used exclusively in the strong inversion zone. Due thereto, there arises the problem that the amplification degree of the differential amplifier is low, and no sufficient amplification can be effected when the amplitude of the input voltage is extremely small.

Further, in the case of a differential amplifier circuit which need not be operated at high speed, the power consumption is increased if the transistors are made to operate in the strong inversion zone.

As stated above, the amplification degree of a differential amplifier which operates in the strong inversion zone is small and the power consumption thereof is large; and thus, it is difficult to use such a differential amplifier in a semiconductor integrated circuit such as, e.g. a band gap reference circuit which is provided therein with a differential amplifier, particularly, required to have accuracy.

BRIEF SUMMARY OF THE INVENTION

The present invention has been made in view of the above-mentioned problem, and it is the object of the invention to realize a semiconductor integrated circuit device provided with the differential amplifier which operates with a low power source voltage and is low in power consumption yet high in amplification degree.

In order to achieve the object mentioned above, according to a first aspect of the present invention, there is provided a semiconductor integrated circuit device with a differential amplifier that comprises:

first and second first conductivity type MOS transistors to respective gates of which input signals are fed, the first and second transistors constituting a differential pair; and third and fourth second conductivity type MOS transistors, the drains of which are connected to the drains of the first and second first conductivity type MOS transistors, respectively the third and fourth transistors constituting load transistor pair with respect to the differential pair, an output signal being delivered through one of a node between the first MOS transistor and the third MOS transistor and a node between the second MOS transistor and the fourth MOS transistor, wherein the first, second, third and fourth MOS transistors are made to operate in a weak inversion region.

According to a second aspect of the present invention, there is provided a semiconductor integrated circuit device with a differential amplifier that comprises:

a first conductivity type MOS transistor to a gate of which a first input voltage is fed;

a second first conductivity type MOS transistor to a gate of which a second input voltage is fed;

a third second conductivity type MOS transistor arranged in such a manner that, to a source thereof, a first voltage is fed, and a gate and a drain thereof are connected to a drain of the first MOS transistor; and a fourth second conductivity type MOS transistor arranged in such a manner that, to a source thereof, the first voltage is fed, and a gate thereof is connected to the drain of the first MOS transistor, while a drain thereof is connected to a drain of the second MOS transistor, and a voltage at this drain is outputted as an output voltage, wherein the first and second MOS transistors and the third and fourth MOS transistors are made to operate in a weak inversion region.

According to a third aspect of the present invention, there is provided a semiconductor integrated circuit device with a differential amplifier that comprises:

first and second first conductivity type MOS transistors to respective gates of which input signals are fed, the first and second MOS transistors constituting a differential pair, and third and fourth second conductivity type MOS transistors the drains of which are connected to the drains of the first and second first conductivity type MOS transistors, respectively, the third and fourth MOS transistors constituting load transistor pair with respect to the differential pair, wherein, through one of a node between the first MOS transistor and the third MOS transistor and the node between the second MOS transistor and the fourth MOS transistor, the output signal is outputted, wherein at least one of the pair of the first and second MOS transistors, and the pair of third and fourth MOS transistors, is comprised of intrinsic MOS transistors.

As described above, in the case of the semiconductor integrated circuit device provided with the differential amplifier according to the present invention, the transistors constituting the differential amplifier operate in a weak inversion region, so that it becomes possible to enhance the amplification degree and to reduce the power consumption.

Further, through the use of the differential amplifier in a band gap reference circuit, it becomes possible to detect extremely small voltage variation, and thus, the output voltage of the band gap reference circuit can be controlled with high accuracy.

Moreover, by putting or incorporating the differential amplifier into a reference voltage generation circuit, a booster circuit or a semiconductor memory device, the performance thereof can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a circuit diagram showing a tenth embodiment of the differential amplifier according to the present invention;

FIG. 14 is a circuit diagram showing an eleventh embodiment of the differential amplifier according to the present invention;

FIG. 15 is a circuit diagram showing a twelfth embodiment of the differential amplifier according to the present invention;

FIG. 16 is a schematic diagram giving an outline of a band gap reference circuit;

FIG. 17 is a circuit diagram showing a thirteenth embodiment of the differential amplifier according to the present invention;

FIG. 18 is a circuit diagram showing a fourteenth embodiment of the differential amplifier according to the present invention;

DETAILED DESCRIPTION OF THE INVENTION

Embodiments of the present invention will now be described by reference to the drawings.

Figure 3:
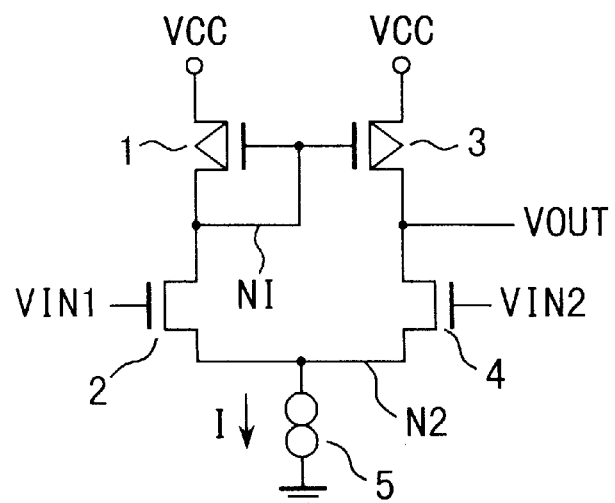
FIG. 3 is a circuit diagram showing a first embodiment of the differential amplifier according to the present invention.

FIG. 3 shows a first embodiment of the present invention. In the following description, the same component elements are referenced by the same reference numerals to thereby omit the repetition of the explanation thereof.

The differential amplifier using a current mirror circuit shown in FIG. 3 is constituted of two n-channel MOS transistors 2, 4 as a differential pair, two p-channel MOS transistors 1, 3 which form a load transistor pair and constitute current mirror circuit, and a constant-current source 5. To the gate of the transistor 2, a first input voltage VIN1 is fed, and the source of the transistor 2 is connected to a first terminal of the constant-current source 5. The first terminal of the constant-current source 5 is also connected to the source of the transistor 4. This node is designated as N2. The second terminal of the constant-current source 5 is grounded. The drain of the transistor 2 is connected to the drain of the transistor 1, the gate of the transistor 1 and the gate of the transistor 3. The potential at this node N1 is designated as VN1. To the source of the transistor 1 and the source of the transistor 3, a power source voltage Vcc is fed. To the gate of the transistor 4, a second input voltage VIN2 is fed, and the drain of the transistor 4 is connected to the drain of the transistor 3. The node between the drain of the transistor 3 and the drain of the transistor 4 is used as an output terminal, from which an output voltage VOUT is outputted.

In this circuit, the transistors 1 to 4 are set so as to operate in a weak inversion range or zone. The way of setting will be described below.

Figure 4A:
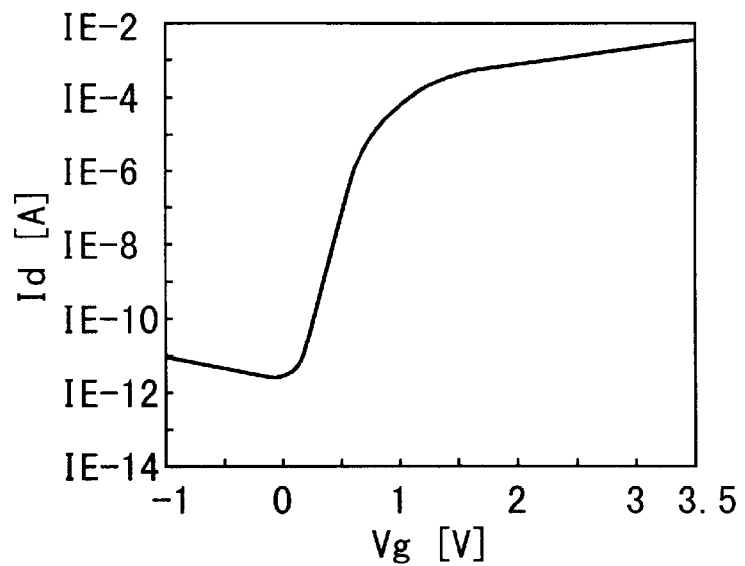
FIG. 4A and FIG. 4B are graphs showing the actually measured Vg-Id characteristics of MOS transistors.

FIG. 4A shows the actually measured values of the Vg-Id characteristic of an n-channel transistor. The measurement was made at normal temperature with a voltage of 4.0 V applied to the drain of the transistor, wherein the gate width and the gate length were 20 $\mu$m and 4 $\mu$m, respectively, and the thickness of the gate oxide film was 12 nm.

Figure 4B:
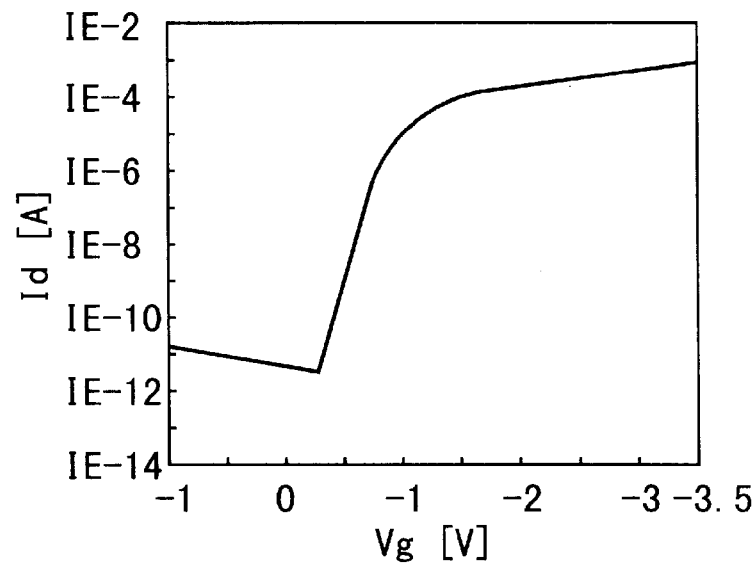

On the other hand, FIG. 4B shows the actually measured values of the Vg-Id characteristic of a p-channel transistor. The measurement was made at normal temperature with a voltage of −4.0 V applied to the drain of the transistor, wherein the gate width and gate length were 20 $\mu$m and 4 $\mu$m respectively, and the thickness of the gate oxide film was 12 nm.

Here, it should be noted that the transistors used in the present invention are each referred to as a MOS transistor the gate insulating film of which comprises an oxide film, but a nitride film, an oxide/nitride film or a film formed by laminating these films to an oxide film may be used equally well as the gate insulating film. The MOS transistors used in the present invention are not at all limited to the type in which the gate insulating film thereof is an oxide film.

According to the graphs shown in FIGS. 4A and 4B, in the case of the n-channel transistor, the range of from Vg=0.2 V to 0.5 V is a weak inversion zone, while in the case of the p-channel transistor, the range of from Vg=−0.3 V to −0.8 V constitutes a weak inversion zone. The S coefficient of this transistor is about 100 mV/Decade.

Therefore, in the case of using such a transistor, if the current value I of the constant-current source 5 is set at, e.g. 100 nA, then the transistors 1 to 4 operate in the weak inversion zone. In this connection, it should be noted that the current value I of the constant-current source 5 is not limited to 100 nA but may be any other value on the order of, e.g. 100 pA to 100 nA at which the transistors 1 to 4 operate in the weak inversion zone.

Figure 1:
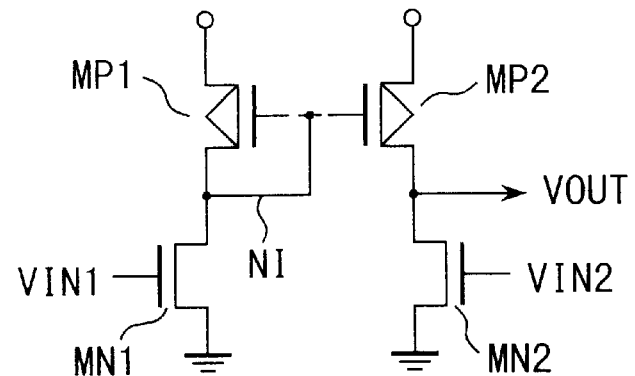
FIG. 1 is a circuit diagram of a conventional differential amplifier.
Figure 2:
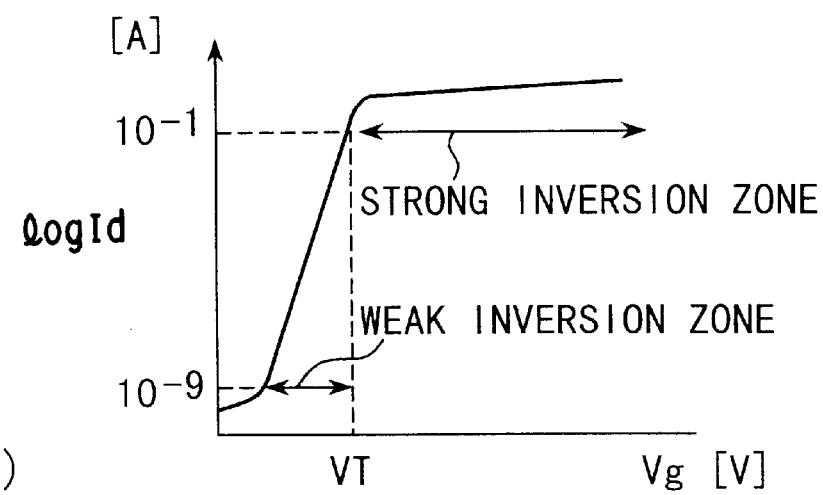
FIG. 2 is a graph showing the Vg-Id characteristic of a MOS transistor.

In the case of a conventional differential amplifier as shown in FIG. 1, in order to enhance the sensitivity, the n-channel transistors MN1, MN2 are made to pentode-operate, whereby the amount of variation of the drain current Id with respect to the gate voltage Vg is increased. That is, $$Id \propto (Vg-Vs-VT)^2 \quad (1)$$

wherein Vs stands for the source potential, and VT stands for the threshold voltage.

In contrast, in the case of this embodiment, the transistors operate in the weak inversion zone, so that $$Id \propto \exp(\alpha \cdot Vg/S) \quad (2)$$

wherein $\alpha$ stands for a constant, and S stands for the S coefficient.

As described above, in the case of this embodiment, the amount of variation of the drain current Id with respect to the gate voltage Vg becomes large in all the MOS transistors. As a result, it becomes possible to increase the amplification degree of the differential amplifier to, e.g. the order of about 1000. For instance, an input voltage difference of 1 mV can be enlarged to 1 V or higher.

As a result, it becomes sufficient to provide only one amplification stage, so that the circuit arrangement is simplified; and thus, it becomes possible to reduce the area occupied by the circuit, to make the AC operation of the circuit be performed at high speed, and to facilitate the circuit analysis.

Further, since the MOS transistors constituting the differential amplifier operate in the weak inversion zone, the power consumption can be reduced.

Figure 5:
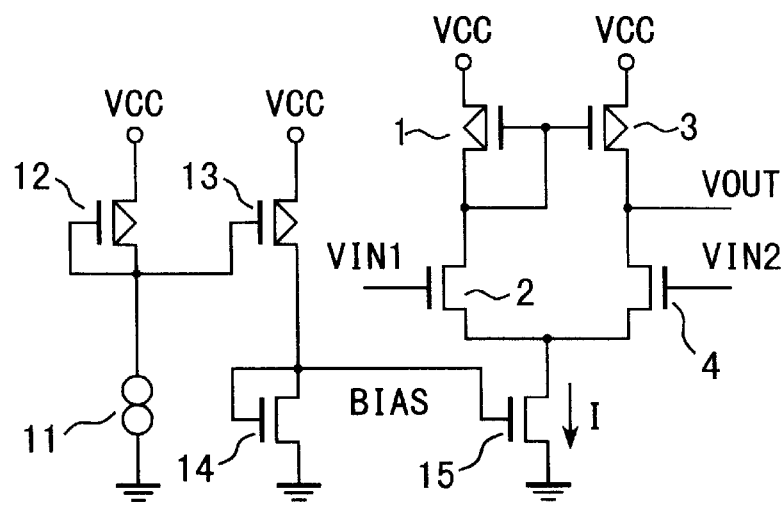
FIG. 5 is a circuit diagram showing a second embodiment of the differential amplifier according to the present invention.

FIG. 5 shows a second embodiment of the present invention.

In the case of the circuit shown in FIG. 5, a circuit comprising a constant-current source 11 and transistors 12 to 15 is used in place of the constant-current source 5 used in the embodiment shown in FIG. 3. The remaining component elements are the same as those shown in FIG. 3.

One end of the constant-current source 11 is grounded, while the other end thereof is connected to the gate of the p-channel MOS transistor 12 and the gate of the p-channel MOS transistor 13. To the sources of the transistors 12 and 13, a power source voltage Vcc is fed. The drain of the transistor 13 is connected to the gate and drain of an n-channel MOS transistor 14 and the gate of an n-channel MOS transistor 15. The source of the transistor 14 is grounded. The drain of the transistor 15 is connected to the sources of n-channel MOS transistors 2,4, and the source of the transistor 15 is grounded. The voltage fed to the gate of the transistor 15 is designated as BIAS.

In this circuit, the drain current of the transistor 15 is set so that the transistors 1 to 4 may operate in the weak inversion zone.

As a result, this embodiment can achieve the same effects as those of the first embodiment.

Figure 6:
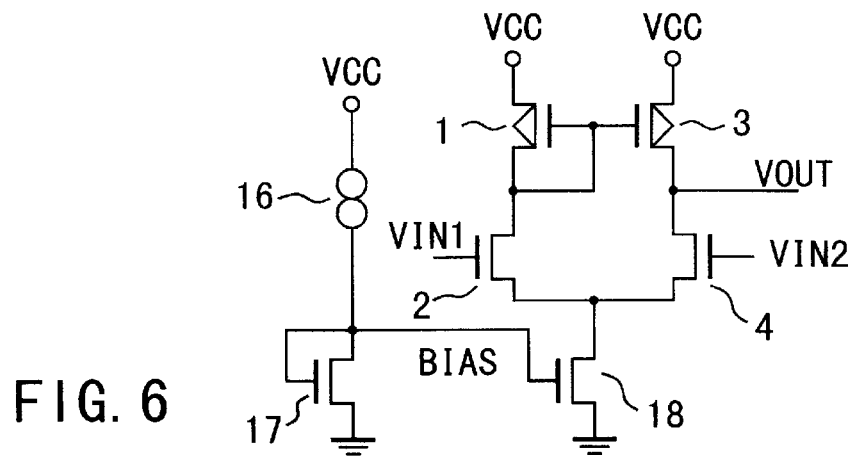
FIG. 6 is a circuit diagram showing a third embodiment of the differential amplifier according to the present invention.

FIG. 6 shows a third embodiment of the present invention.

In the circuit shown in FIG. 6, a circuit comprising a constant-current source 16 and transistors 17, 18 is used in place of the constant-current source 5 used in the embodiment shown in FIG. 3. The remaining component elements are the same as those shown in FIG. 1.

To one end of a constant-current source 16, a power source voltage Vcc is fed, and the other end thereof is connected to the gate and drain of the n-channel MOS transistor 17 and the gate of the n-channel MOS transistor 18. The source of the transistor 17 is grounded. The drain of the transistor 18 is connected to the sources of the n-channel MOS transistors 2, 4, and the source of the transistor 18 is grounded. The voltage fed to the gate of the transistor 18 is designated as BIAS.

In this circuit, the drain current of the transistor 18 is set so that the transistors 1 to 4 may operate in the weak inversion region.

As a result, this embodiment can achieve the same effects as those of the first embodiment.

Figure 7:
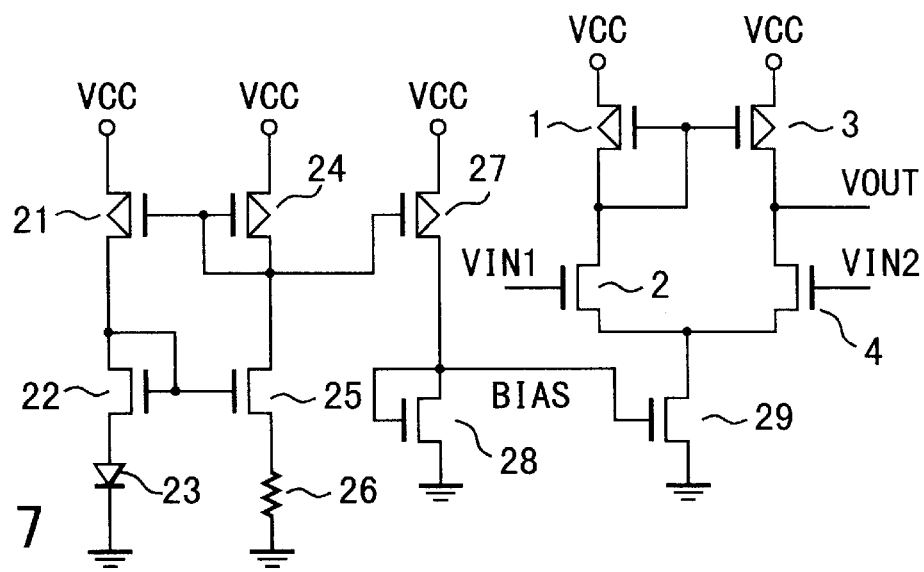
FIG. 7 is a circuit diagram showing a fourth embodiment of the differential amplifier according to the present invention.

FIG. 7 shows a fourth embodiment of the present invention.

In the case of the circuit shown in FIG. 7, a Wilson current mirror circuit is used in place of the constant-current source 5 for generating constant current used in the embodiment shown in FIG. 3. The remaining component elements are the same as those used in the circuit shown in FIG. 3.

As shown in FIG. 7, to the source of a p-channel MOS transistor 21, a power source voltage Vcc is fed. The gate of the transistor 21 is connected to the gate and drain of a p-channel MOS transistor 24, the gate of a p-channel MOS transistor 27 and the drain of an n-channel MOS transistor 25. To the source of transistor 24, the power source voltage Vcc is fed. The drain of the transistor 21 is connected to the drain and gate of an n-channel MOS transistor 22 and the gate of an n-channel MOS transistor 25. The source of the transistor 22 is connected to the anode of a diode 23, and the cathode of the diode 23 is grounded. The voltage drop between the anode and cathode of the diode 23 is designated as Vf. The source of a transistor 25 is connected to one end of a resistor 26, and the other end of the resistor 26 is grounded. The resistance value of the resistor 26 is assumed to be R. To the source of a transistor 27, the power source voltage Vcc is fed. The drain of the transistor 27 is connected to the gate and drain of an n-channel MOS transistor 28 and the gate of an n-channel MOS transistor 29. The source of the transistor 28 is grounded. The drain of the transistor 29 is connected to the sources of the n-channel MOS transistors 2, 4, and the source of the transistor 29 is grounded. The voltage fed to the gate of the transistor 29 is designated as BIAS.

In the Wilson current mirror circuit, the current value I flowing through the resistor 26 is determined by Vf/R. Therefore, by suitably setting the value of the resistance R, the drain current value of the transistor 29 is set so that the transistors 1 to 4 may operate in the weak inversion zone.

Thus, according to this embodiment, the same effects as those of the first embodiment can be obtained. Further, the Wilson current mirror circuit can be easily formed by the use of the CMOS process, so that the constant-current source can be easily mounted on a semiconductor integrated circuit. Further, even if a process fluctuation occurs, the Vf of the diode fluctuates very little, so that the output current of the constant-current source is influenced only by the resistance fluctuation. As a result, the fluctuation of the output current from the constant-current source can be reduced.

Figure 8:
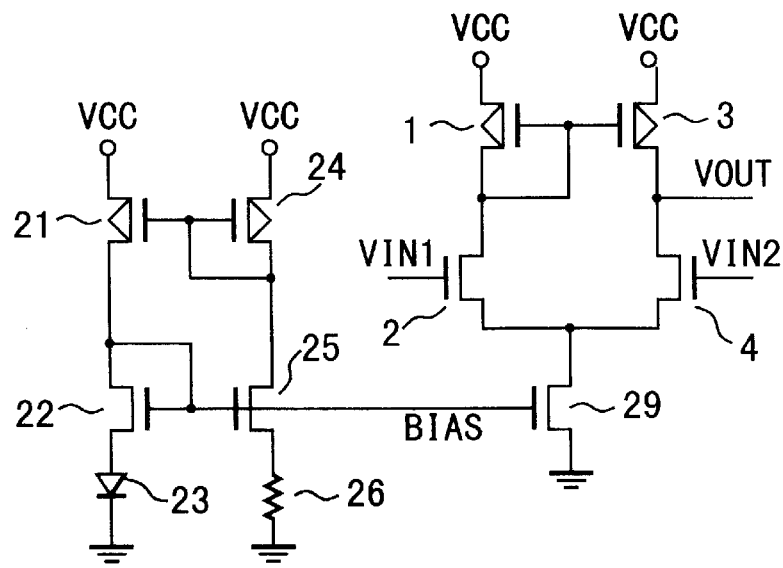
FIG. 8 is a circuit diagram showing a fifth embodiment of the differential amplifier according to the present invention.

FIG. 8 shows a fifth embodiment of the present invention.

The circuit shown in FIG. 8 comprises the remaining portion of the circuit shown in FIG. 5 after removing the p-channel MOS transistor 27 and the n-channel MOS transistor 28 from the circuit. In the circuit shown in FIG. 8, the gate of the n-channel MOS transistor 29 is connected to the gate of the n-channel MOS transistor 25. The remaining arrangement of the circuit is the same as that of the circuit shown in FIG. 7.

The value of the current flowing through the resistor 26 in this Wilson current mirror circuit is determined by Vf/R. Therefore, the resistance value R of the resistor 26 is set, so that the drain current of the transistor 29 is suitably adjusted to ensure that the transistors 1 to 4 operate in the weak inversion zone.

As a result, according to this embodiment, the same effects as those of the fourth embodiment can be obtained.

Figure 9:
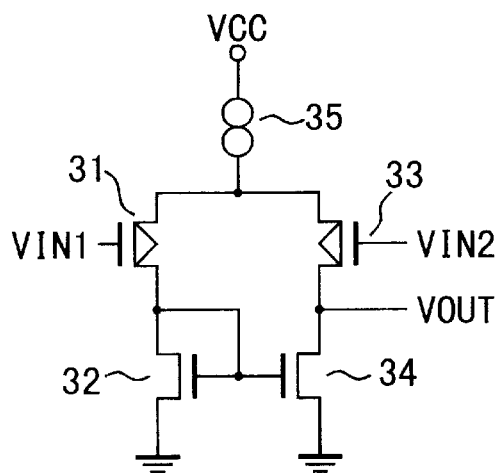
FIG. 9 is a circuit diagram showing a sixth embodiment of the differential amplifier according to the present invention.

FIG. 9 shows a sixth embodiment of the present invention.

As shown in FIG. 9, to one end of a constant-current source 35, a power source voltage Vcc is fed, and the other end thereof is connected to the source of a p-channel MOS transistor 31 and the source of a p-channel MOS transistor 33. To the gate of the transistor 31, a first input voltage VIN1 is fed, and the drain of the transistor 31 is connected to the drain and the gate of an n-channel MOS transistor 32 and the gate of an n-channel MOS transistor 34. The source of the transistor 32 is grounded. The source of the p-channel MOS transistor 33 is connected to the other end of the constant-current source 35, and to the gate of the transistor 33, a second input voltage VIN2 is fed. The drain of the transistor 33 is connected to the drain of an n-channel MOS transistor 34, and, from this node, an output voltage VOUT is delivered. The source of the transistor 34 is grounded.

That is, the differential amplifier according to the embodiment shown in FIG. 9 is constituted in such a manner that the p-channel MOS transistors and the n-channel MOS transistors in the embodiment shown in FIG. 3 change places with each other, whereby the input voltages are fed to the gates of the p-channel MOS transistors 31, 33.

In this circuit, the output current of the constant-current source 35 is set so that the transistors 31 to 34 may operate in the weak inversion zone.

As a result, according to this embodiment, the same effects as those of the first embodiment can be obtained.

Figure 10:
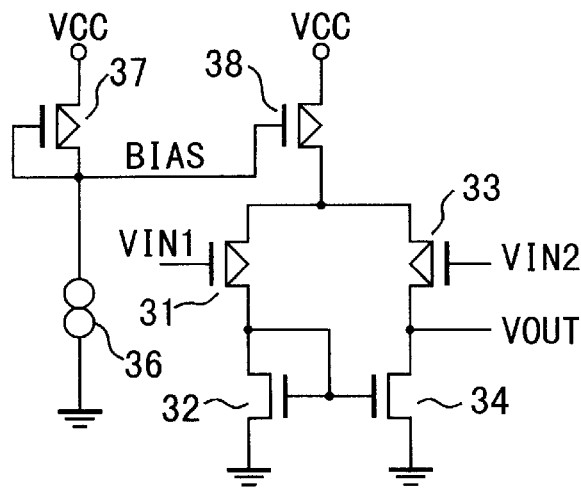
FIG. 10 is a circuit diagram showing a seventh embodiment of the differential amplifier according to the present invention.

FIG. 10 shows a seventh embodiment of the present invention.

In the circuit shown in FIG. 10, a circuit comprising a constant-current source 36 and transistors 37, 38 is used in place of the constant-current source 35 used in the embodiment shown in FIG. 9. The other component elements are the same as those used in the circuit shown in FIG. 9.

One end of the constant-current source 36 is grounded, while the other end of the constant-current source 36 is connected to the gate and drain of a p-channel MOS transistor 37 and the gate of a p-channel MOS transistor 38. To the sources of the transistors 37, 38, a power source voltage Vcc is fed. The voltage fed to the gate of the transistor 38 is designated as BIAS. The drain of the transistor 38 is connected to the source of a p-channel MOS transistor 31 and the source of a p-channel MOS transistor 33.

In this circuit, the drain current of the transistor 38 is set so that the transistors 31 to 34 may operate in the weak inversion zone.

As a result, according to this embodiment, the same effects as those of the first embodiment can be obtained.

Figure 11:
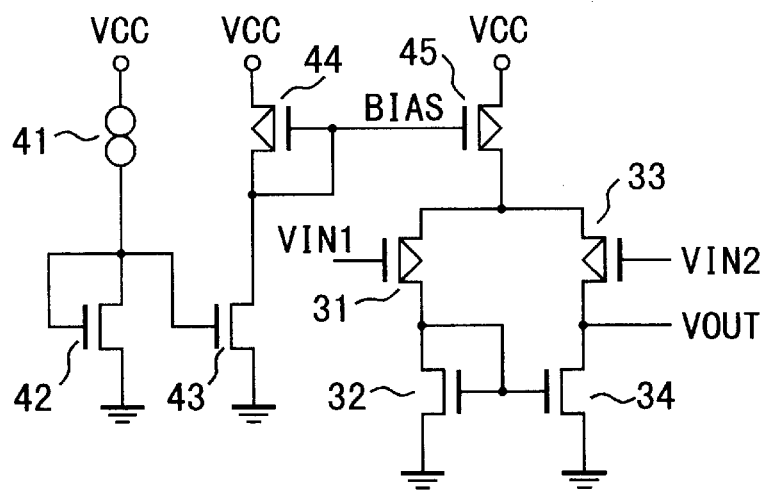
FIG. 11 is a circuit diagram showing an eighth embodiment of the differential amplifier according to the present invention.

FIG. 11 shows an eighth embodiment of the present invention.

In the circuit shown in FIG. 11, a circuit comprising a constant-current source 41 and transistors 42 to 45 is used in place of the constant-current source 35 used in the embodiment shown in FIG. 9. The remaining component elements are the same as those used in the circuit shown in FIG. 9.

To one end of the constant-current source 41, a power source voltage Vcc is fed. The other end of the constant-current source 41 is connected to the gate and drain of an n-channel MOS transistor 42 and the gate of an n-channel MOS transistor 43. The source of the n-channel MOS transistor 43 is grounded. The drain of the transistor 4 3 is connect ed to the gate and drain of the p-channel MOS transistor 44 and the gate of the p-channel MOS transistor 45. The voltage fed to the gate of the transistor 45 is designated as BIAS. To the source of the transistor 441 the power source voltage Vcc is fed. To the source of the transistor 45, the power source voltage Vcc is fed, and the drain of the transistor 45 is connected to the source of a p-channel MOS transistor 31 and the source of a p-channel MOS transistor 33.

In this circuit, the drain current o f the transistor 45 is set so that the transistors 31 to 34 may operate i n the weak inversion zone.

As a result, according to this embodiment, the same effects as those of the first embodiment can be obtained.

Figure 12:
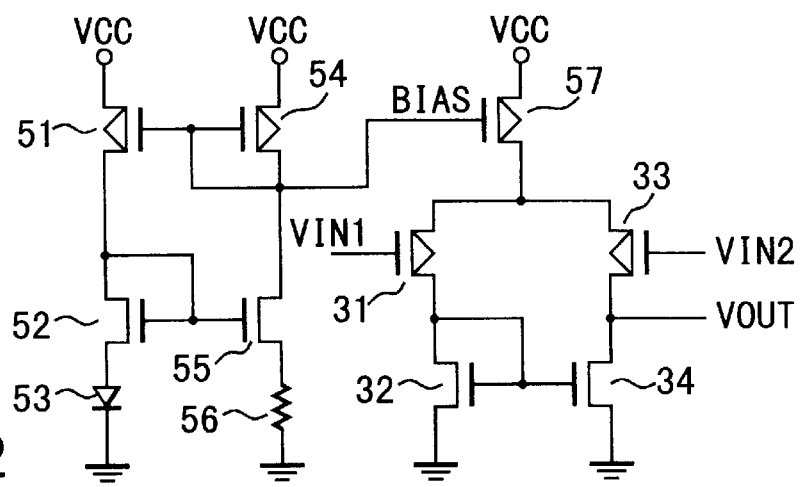
FIG. 12 is a circuit diagram showing a ninth embodiment of the differential amplifier according to the present invention.

FIG. 12 shows a ninth embodiment of the present invention.

In the circuit shown in FIG. 12, a Wilson current mirror circuit is used in place of the constant-current source 35 used in the embodiment shown in FIG. 9. The other component elements are the same as those used in the circuit shown in FIG. 9.

As shown in FIG. 12, to the source of a p-channel MOS transistor 51, a power source voltage Vcc is fed. The gate of the transistor 51 is connected to the gate and drain of a p-channel MOS transistor 54, the gate of a p-channel MOS transistor 57 and the drain of an n-channel MOS transistor 55. To the source of the transistor 54, the power source voltage Vcc is fed. The drain of the transistor 51 is connected to the drain and gate of an n-channel MOS transistor 52 and the gate of an n-channel MOS transistor 55. The source of the transistor 52 is connected to the anode of a diode 53, and the cathode of the diode 53 is grounded. The voltage drop caused between the anode and cathode of the diode 53 is designated as Vf. The source of the transistor 55 is connected to one end of a resistor 56, while the other end of the resistor 56 is grounded. The resistance value of the resistor 56 is denoted by R. To the source of the transistor 57, the power source voltage Vcc is fed. The drain of the transistor 57 is connected to the source of an n-channel MOS transistor 31 and the source of an n-channel MOS transistor 33. The voltage fed to the gate of the transistor 57 is designated as BIAS.

In this Wilson current mirror circuit, the value of the current flowing through the resistor 56 is determined by Vf/R. Therefore, by adjusting the resistance value of the resistor 56, the drain current of the transistor 57 is set so that the transistors 31 to 34 may operate in the weak inversion zone.

As a result, according to this embodiment, the same effects as those of the fourth embodiment can be obtained.

FIG. 13 shows a tenth embodiment of the present invention.

The circuit shown in FIG. 13 is constituted in such a manner that, in the circuit shown in FIG. 7, the diode 23 is replaced by an n-channel MOS transistor 30.

As shown in FIG. 13, the drain and gate of an n-channel MOS transistor 30 are connected to the source of an n-channel MOS transistor 22. The source of an n-channel MOS transistor 30 is grounded. The other component elements are the same as those used in the circuit shown in FIG. 7.

If it is assumed that the threshold value of this n-channel MOS transistor 30 is VT, then the value of the current flowing through the resistor 26 is expressed as VT/R. Therefore, by adjusting the resistance value of the resistor 26, the drain current of the transistor 29 is set so that the transistors 1 to 4 may operate in the weak inversion zone.

As a result, according to this embodiment, the same effects as those of the fifth embodiment can be obtained.

FIG. 14 shows an eleventh embodiment of the present invention.

The circuit shown in FIG. 14 is constituted in such a manner that the current mirror circuit shown in FIG. 13 which is comprised of the transistors 21 to 25 and 30 and the resistor 26 is replaced by a current mirror circuit comprising transistors 61 to 64 and a resistor 65. The other component elements are the same as those used in the circuit shown in FIG. 13.

To the source of a p-channel MOS transistor 61 and the source of a p-channel MOS transistor 63, a power source voltage Vcc is fed. The gate of the transistor 61 is connected to the gate and drain of the transistor 63 and the drain of an n-channel MOS transistor 64 and, further, connected to the gate of a p-channel MOS transistor 27. The drain of the transistor 61 is connected to the gate of the transistor 64 and the drain of an n-channel MOS transistor 62. The source of the transistor 62 is grounded. The gate of the transistor 62 is connected to the source of the transistor 64 and one end of a resistor 65. The other end of the resistor 65 is grounded.

If it is assumed that VT stands for the threshold value of this n-channel MOS transistor 62, and R stands for the resistance value of the resistor 65, then the value of the current flowing through the resistor 65 is represented as VT/R. Therefore, by adjusting the resistance value R of the resistor 65, the drain current of the transistor 29 is set so that transistors 1 to 4 may operate in the weak inversion region.

As is apparent from the above, according to this embodiment, the same effects as those of the fifth embodiment can be obtained.

FIG. 15 shows a twelfth embodiment of the present invention.

This embodiment is an application of the above-described embodiment to a band gap reference circuit which is a reference voltage generating circuit. The circuit shown in FIG. 15 comprises an application of the differential amplifier shown in FIG. 7 to a band gap reference circuit.

In the differential amplifier, to the gate of an n-channel MOS transistor 2, an input voltage VB is fed, and, to the gate of an n-channel MOS transistor 4, an input voltage VA is fed. Further, the voltage fed to the gate of a transistor 29 is designated as BGRBIAS.

The node between the drain of a p-channel MOS transistor 3 and the drain of an n-channel MOS transistor 4 in the differential amplifier is connected to the gate of a p-channel MOS transistor 71 as an output stage. To the source of the transistor 71, a power source voltage Vcc is fed, and the drain of the transistor 71 is connected to one end of a resistor 72 and one end of a resistor 74. The other end of the resistor 72 is connected to the anode of a diode 73, and the cathode of the diode 73 is grounded. The other end of the resistor 74 is connected to one end of a resistor 75, while the other end of the resistor 75 is connected to the anode of a diode 76, and the cathode of the diode 76 is grounded. The voltage at the node between the other end of the resistor 72 and the anode of the diode 73 is the input voltage VA, and the voltage at the node between the other end of the resistor 74 and one end of the resistor 75 is the input voltage VB.

Provided at the node among the drain of the transistor 71, one end of the resistor 72 and one end of the resistor 74 is an output terminal for a reference voltage VREF.

By the way, in FIG. 16, there is shown a circuit diagram of a basic band gap reference circuit.

To the inverting input terminal and the non-inverting input terminal of a differential amplifier 81, the input voltage VA and the input voltage VB are fed, respectively, and the output terminal of the differential amplifier 81 is connected to one end of a resistor 82 and one end of a resistor 84. The output voltage of the differential amplifier 81 is used as, e.g.

the reference voltage VREF. The other end of the resistor 82 and the anode of a diode 83 are connected to each other, and the voltage at the node therebetween becomes the input voltage VA. The cathode of the diode 83 is grounded. The other end of the resistor 84 is connected to one end of a resistor 85, and the voltage at the node therebetween becomes the input voltage VB. The other end of the resistor 85 is connected to the anode of a diode 86, and the cathode of the diode 86 is grounded.

It is now to be assumed that such a band gap reference circuit is brought into a stable state; and the input voltage Va and the input voltage VB have become equal to each other. It is also to be assumed that R1, R2, and RD stand for the resistance values of the resistor 85, the resistor 84, and the resistor 82, respectively, and I1 and I2 stand for the values of the currents flowing through the resistor 84 and the resistor 82, and VF1 stands for the voltage drop across the diode 83.

In this case, VREF=VF1+R2·1D. If this equation is partially differentiated by the absolute temperature T, we have $$\partial VREF/\partial T = \partial VF1/\partial T + (R2/R1)\cdot(k/q)\ln(I1/I2) \qquad (3)$$

wherein k stands for Boltzmann's constant, and q stands for the amount of charge.

The first term at the right side of the above-indicated equation is usually −2 mV/deg. In the band gap reference circuit, the resistance values R1, R2 and RD are appropriately set to cancel out the temperature variation in Vf of this diode, whereby the temperature variation in the VREF is brought to zero.

If this differential amplifier is composed of a conventional circuit arrangement, then, in case the amplitudes of the voltages VA,VB are so small as about 1 mV, the differential amplifier cannot detect the difference on the order of 1 mV. As a result, it becomes difficult to set the reference voltage VREF within the target value which is, e.g. 1.25 V±5%.

In contrast, if the band gap reference circuit is constituted by the use of the differential amplifier according to the present invention as in the case of the embodiment shown in FIG. 15, the transistors 1 to 4 constituting the differential amplifier operate in the weak inversion zone, so that the power consumption is reduced, and at the same time, the amplification degree of the differential amplifier is enhanced. As a result, the differential amplifier can detect the input voltage difference on the order of 1 mV; and thus, the output voltage VREF of the band gap reference circuit can be controlled with high accuracy.

Further, in the embodiment shown in FIG. 15, the n-channel MOS transistors 2, 4, 22, 25 can alternatively be formed as intrinsic n-channel MOS transistors (natural or native type MOS transistors) which are formed on a p-type substrate, and ion implantation for the formation of channels is not made in the channel regions. Since, in the case of the intrinsic MOS transistors, no channel ion implantation is made therein, the fluctuation or dispersion in the threshold values of the MOS transistors is smaller than the fluctuation in the threshold values of the enhancement type MOS transistors. As a result, the threshold value of the transistor 2 and the threshold value of the transistor 4 become approximately equal to each other, and thus, the fluctuation in the output voltage VREF of the band gap reference circuit can be reduced.

Further, in the case of the band gap reference circuit according to the embodiment shown in FIG. 15, the differential amplifier shown in FIG. 7 is used, but, even if any of the other differential amplifiers described above is used, the same effects can be obtained.

FIG. 17 shows a thirteenth embodiment of the present invention.

This embodiment lies in a band gap reference circuit constituted in such a manner that, in the embodiment shown in FIG. 15, the differential amplifier circuit shown in FIG. 12 is used in place of the differential amplifier circuit shown in FIG. 7.

A transistor 71, resistors 72, 74, 75, and diodes 73 and 76 are of the same structures as those used in the embodiment shown in FIG. 15.

The node between the drain of a p-channel MOS transistor 33 and the drain of an n-channel MOS transistor 34 in the differential amplifier shown in FIG. 12 is connected to the gate of the p-channel MOS transistor 71 as an output stage. To the gate of the p-channel MOS transistor 33, the input voltage VA is fed, and to the gate of the p-channel MOS transistor 31, the input voltage VB is fed.

Provided at the node between the p-channel MOS transistor 71 and the resistors 72, 74 is an output terminal for outputting the reference potential VREF. Further, the voltage fed to the gate of the transistor 57 is designated as BGR-BIAS.

According to this embodiment, the same effects as those of the band gap reference circuit shown in FIG. 15 can be obtained.

FIG. 18 shows the band gap reference circuit according to a fourteenth embodiment of the present invention.

This embodiment is constituted in such a manner that, in the embodiment shown in FIG. 17, a constant-current source 87 is provided in place of the p-channel MOS transistor 57 for the constant-current source; intrinsic p-channel MOS transistors 31*a*, 33*a* are provided in place of the enhancement type p-channel MOS transistors 31, 33 constituting the differential pair in the differential amplifier; and further, instead of connecting the node between the drain of p-channel MOS transistor 33*a* and the drain of n-channel MOS transistor 34 in the differential amplifier directly to the gate of the p-channel MOS transistor 71, the node is connected to the gate of the MOS transistor 71 through an inverting amplifier circuit comprising a constant-current source 88 and an n-channel MOS transistor 89. As a result of the provision of the inverting amplifier circuit comprising the constant-current source 88 and the MOS transistor 89, it is ensured that, to the gate of the p-channel MOS transistor 31*a*, the input voltage VA is fed, while to the gate of the p-channel MOS transistor 33*a*, the input voltage VB is fed.

That is, in this embodiment, intrinsic MOS transistors (natural or native type MOS transistors) which are formed on an n-type substrate and have no ion implantation for channel formation made into the channel regions are used as the p-channel MOS transistors 31*a*, 33*a*; and therefore, the fluctuation in the threshold values of these MOS transistors is smaller than the fluctuation in the threshold values of the enhancement type MOS transistors. As a result, the fluctuation or variation in the output voltage VREF of the band gap reference can be reduced.

That is, in this embodiment, intrinsic MOS transistors are used as the MOS transistors 31*a*, 33*a*, so that the fluctuation in the threshold values of these MOS transistors becomes smaller than the fluctuation in the threshold values of enhancement type MOS transistors, as a result of which the fluctuation in the output voltage VREF can be reduced.

For instance, as disclosed in the known literature, "IEEE TRANSACTION ON ELECTRON DEVICES, VOL.41, NO.11, NOVEMBER 1994 pp. 2216 to 2221, "Experimental Study of Threshold Voltage Fluctuation Due to Statistical Variation of Channel Dopant Number in MOSFET's", Tomohisa Mizuno et.al, it is reported that both in the p-channel and n-channel MOS transistors, the threshold value fluctuation is inversely proportional to the square root of the product of the gate width and the effective channel length, and as for the cause for the fluctuation, 95% or higher in the case of p-channel MOS transistors and 85% or higher in the case of n-channel MOS transistors are determined depending on the dose fluctuation at the time of channel implantation. That is, the threshold value fluctuation is mostly determined depending on the channel implantation dose. Accordingly, if intrinsic MOS transistors in which no channel implantation is made are used as the MOS transistors 31a, 33a, then the threshold value fluctuation comes not to exist practically, and thus, the fluctuation of the reference voltage VRE can be also suppressed.

Figure 19:
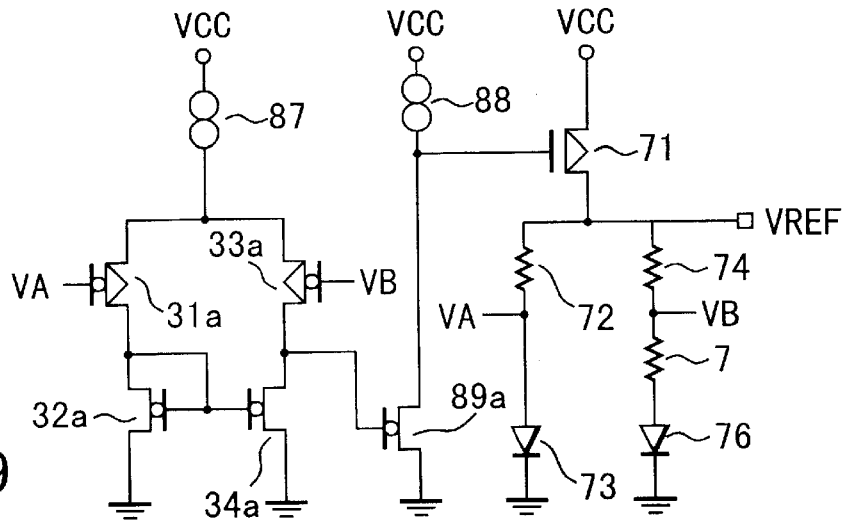
FIG. 19 is a circuit diagram showing a fifteenth embodiment of the differential amplifier according to the present invention.

FIG. 19 shows the band gap reference circuit according to a fifteenth embodiment of the present invention.

This embodiment is constituted in such a manner that, in the embodiment shown in FIG. 18, intrinsic MOS transistors are used as the p-channel MOS transistors 31a, 33a to which the input voltages VA, VB are fed, and at the same time, in place of the n-channel MOS transistors 32, 34 constituting the load transistor pair with respect to the two MOS transistors 31a, 33a, and the transistor 89, intrinsic n-channel MOS transistors 32a, 34a, 89a are used, respectively.

That is, as a result of the recent tendency to lowering the voltage of power source voltages Vcc, the fluctuation in threshold value due to the fluctuation in processing of transistors has come to be unignorable. A current mirror circuit, which is well symmetric, outputs a current at a desired current ratio on the premise that the there is no variation or fluctuation in the characteristics of the transistors. However, if there is a fluctuation in the threshold values of the transistors, then the circuit operation is stabilized in the state in which both gate voltages are not equal to each other, and thus, the current cannot be outputted at a desired current ratio any more. Further, in the circuit shown in FIG. 18, the output from the differential amplifier is amplified by the inverting amplifier circuit, so that the circuit is stabilized in the state in which the reference voltage VREF is imbalanced.

If it is now assumed that, in FIG. 18, the resistance values of a resistor 72, a resistor 74 and a resistor 75 are RD, R2 and R1 respectively, that the values of the currents flowing through the resistor 72 and the resistor 75 are I1 and I2 respectively, and that the voltage drops caused across diodes 73, 76 are VF1 and VF2 respectively, and if it is further assumed that, when the current mirror circuit in the differential amplifier shown in FIG. 18 is composed of enhancement type MOS transistors, the two MOS transistors constituting the current mirror circuit have a fluctuation or dispersion in their threshold values, and thus, a potential difference V is caused between the input voltages VA, VB, then the following equations (4) and (5) hold:

$$VF1 + \Delta V = R1 \cdot I2 + VF2 \quad (4)$$

$$RD \cdot I1 = R2 \cdot I2 + V \quad (5)$$

In this case, the value of the reference voltage VREF is given by the following equation:

$$VREF = VF1 + (R2/R1)(VF1 - VF2) + \{1 + (R2/R1)\}V \quad (6)$$

That is, if the threshold values have a fluctuation or dispersion, this threshold value dispersion is reflected on the reference voltage VREF.

However, in this embodiment, intrinsic MOS transistors are used as the MOS transistors 32a, 34a constituting the current mirror circuit and MOS transistor 89a gate of which is controlled by a output of the current mirror circuit, so that the fluctuation in the threshold values of these MOS transistors becomes smaller than the fluctuation in the threshold values of enhancement type MOS transistors, as a result of which the fluctuation in the output voltage VREF can be further reduced.

Figure 20:
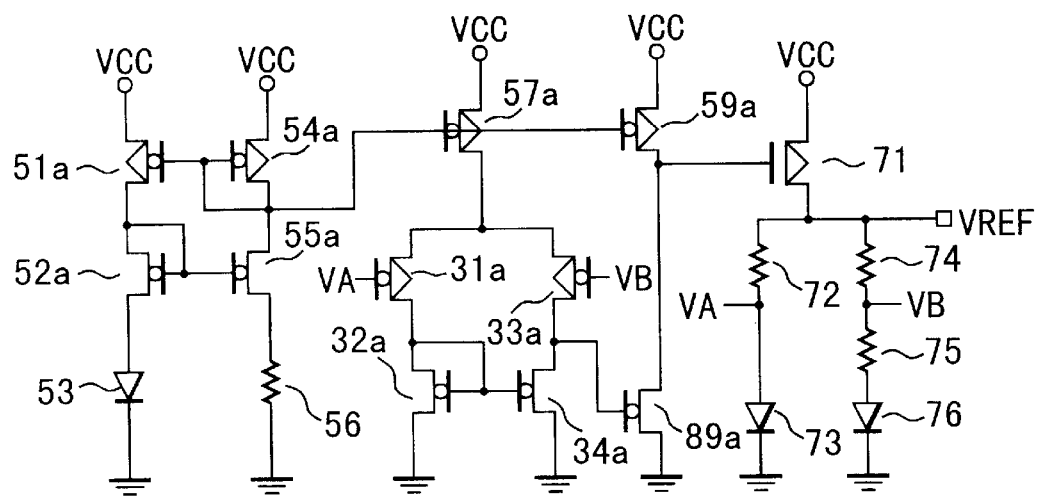
FIG. 20 is a circuit diagram showing a sixteenth embodiment of the differential amplifier according to the present invention.

FIG. 20 shows the band gap reference circuit according to a sixteenth embodiment of the present invention.

This embodiment is constituted in such a manner that, in the embodiment shown in FIG. 19, the constant-current sources 87, 88 are replaced by a Wilson current mirror circuit of approximately the same structure as that used in the embodiment shown in FIG. 12. The other component elements are the same as those used in the circuit shown in FIG. 19. Further, in this embodiment, intrinsic p-channel MOS transistor 51a, 54a, 57a are used in place of the p-channel MOS transistors 51, 54, 57 respectively, and intrinsic n-channel MOS transistors 52a, 55a are used in place of the n-channel MOS transistors 52, 55, respectively. Further, a current proportional to the current produced in the Wilson current mirror circuit is fed to the differential amplifier via an intrinsic p-channel MOS transistor 57a, and, similarly, a current proportional to the current produced by the Wilson current mirror circuit is fed to an n-channel MOS transistor 89 of the inverting amplifier circuit via an intrinsic p-channel MOS transistor 59a.

Further, in each of the embodiments shown in FIGS. 17 to 20, as the differential amplifier, there is used a differential amplifier constituted in such a manner that the transistors which receive the input voltages VA, VB are p-channel transistors, but, instead of such differential amplifier, it is also possible to use a differential amplifier constituted in such a manner that, for instance, as shown in FIG. 3, the transistors which receive the input voltages VA,VB through the gates thereof are n-channel transistors as shown in, e.g. FIG. 3. In this case, also, intrinsic MOS transistors are preferably used for the two MOS transistors, the gate of which are fed with the input voltages VA, VB and the transistor pair constituting the current mirror circuit.

Figure 21:
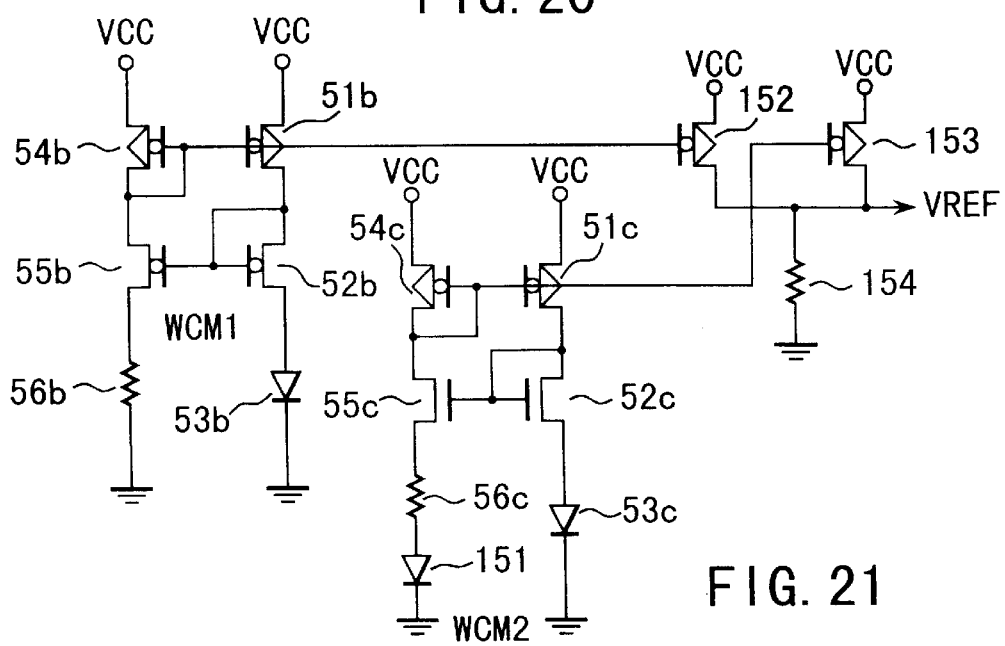
FIG. 21 is a circuit diagram showing a seventeenth embodiment of the differential amplifier according to the present invention.

FIG. 21 shows the band gap reference circuit according to a seventeenth embodiment of the present invention. This embodiment is of the circuit type according to which the reference voltage VREF is produced without using such a differential amplifier as mentioned above. The circuit according to this embodiment comprises a first Wilson current mirror circuit WCMI consisting of MOS transistors 51b, 52b, 54b, 55b, a diode 53b and a resistor 56b, the first Wilson current mirror circuit WCM1 corresponding to the Wilson current mirror consisting of the MOS transistors 51, 52, 54, 55, the diode 53 and the resistor 56 shown in FIG. 17; a second Wilson current mirror circuit WCM2 consisting of MOS transistors 51c, 52c, 54c, 55c, a diode 53c and a resistor 56c corresponding to the MOS transistors 51b, 52b, 54b, 55b, the diode 53b and the resistor 56, and a diode 151 connected between the resistor 56c and the ground potential; a p-channel MOS transistor 152 arranged in such a manner that the gate thereof is connected in common with the gates of the MOS transistors 51b, 54b in the first Wilson current mirror circuit WCM1, and to the source of the p-channel MOS transistor 152, the power source voltage Vcc is fed; a p-channel MOS transistor 153 arranged in such a manner that the gate thereof is connected in common with the gates of the MOS transistors 51c, 54c in the second Wilson current mirror circuit WCM2, and to the source of the p-channel MOS transistor 153, the power source voltage Vcc is fed, and the drain thereof is connected in common with the drain of the p-channel MOS transistor 152; and a resistor 154 connected between the common drain of the p-channel MOS transistors 152, 153 and the ground potential.

If it is assumed that, in this circuit arrangement, the forward voltage drop across the diode 53b in the first Wilson current mirror circuit WCM1 and the voltage drop across the diode 53c in the second Wilson current mirror circuit WCM2 are both VF1, the forward voltage drop across the diode 151 in the second Wilson current mirror circuit WCM2 is VF2, the resistance value of the resistor 56b in the first Wilson current mirror circuit WCM1 and the resistance value of the resistor 56c in the second Wilson current mirror circuit WCM2 are R1 and R2, respectively, then the current I1 flowing through the resistor 56b in the first Wilson current mirror circuit WCM1 and the current I2 flowing through the resistor 56c in the second Wilson current mirror circuit WCM2 are represented by the following equations, respectively:

$$I1 = VF1/R1 \tag{7}$$

$$I2 = (VF1 - VF2)/R2 \tag{8}$$

wherein the gm ratio of the respective current mirror circuits is assumed to be 1.

Here, the MOS transistor 152 constitutes a current mirror circuit in cooperation with the MOS transistor 54b in the first Wilson current mirror circuit WCM1, and the MOS transistor 153 constitutes a current mirror circuit together with the MOS transistor 54c in the second Wilson current mirror circuit WCM1. If it is assumed that the gm ratios of these two current mirror circuits are also 1, then, to the MOS transistor 152, the current I1 flows, while to the MOS transistor 153, the current I2 flows. Here, if it is assumed that the resistance value of the resistor 154 is R1, then a current (I1 to I2) flows to this resistor 154, so that, from the one end of the resistor 154, a reference voltage VREF as represented by the following equation is produced:

$$\begin{aligned} VREF &= R1(I1 + I2) \\ &= VF1 + (VF1 - VF2)(R1/R2) \end{aligned} \tag{9}$$

In the case of this embodiment, intrinsic MOS transistors are likewise used as the MOS transistors 51b, 54b, 152, and intrinsic MOS transistors are used as the MOS transistors 51c, 54c, 153. Due to this, the fluctuation in the threshold values of these MOS transistors becomes smaller than the fluctuation in the threshold values of the enhancement type MOS transistors, as a result of which the fluctuation of the output voltage VREF can be reduced.

Further, if, in this embodiment, intrinsic MOS transistors are used as the MOS transistors 52b, 55b, and intrinsic MOS transistors are used as the MOS transistors 52c, 55c, then the fluctuation of the output voltage VREF can be further reduced.

By the way, here is a problem: In the case where, in the band gap reference circuit according to the present invention shown in FIG. 15 etc., the output voltage VREF is subjected to variation for some cause, it takes some time for the differential amplifier to restore itself to normalcy from the variation, this being a problem. Thus, it is necessary to ensure that, even if the power source voltage Vcc has varied, the output voltage VREF remains free from variation.

Figure 22:
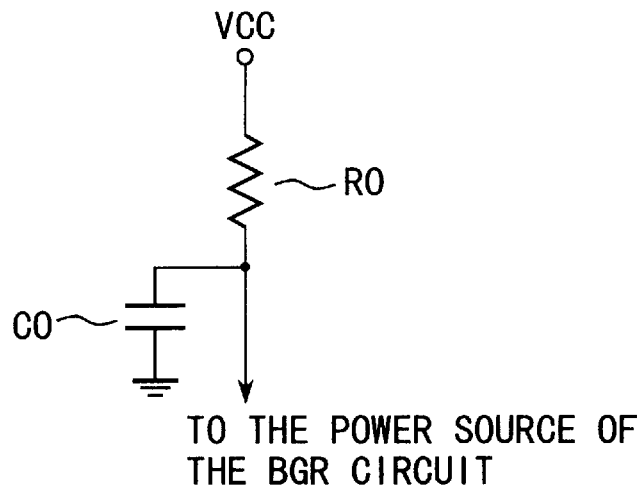
FIG. 22 is a circuit diagram of the low-pass filter used in the differential amplifier according to the present invention.

First, it is thought of the technical measure of feeding the power source voltage Vcc not directly, but through a low-pass filter as shown in FIG. 22, to the power source terminal of the band gap reference circuit as shown in FIG. 15 etc.

The low-pass filter shown in FIG. 22 is constituted in such a manner that, to one end of a resistor RO, the power source voltage Vcc is fed, while to the other end of the resistor RO, one end of a capacitor CO is connected, and the other end of the capacitor CO is grounded. The node between the resistor RO and the capacitor CO is connected to the power source terminal of the band gap reference circuit.

By the use of this low-pass filter, it can be ensured that, in case, for instance, a noise is superimposed on the power source voltage Vcc, and, as a result, the power source voltage Vcc varies faster than the time constant CR determined depending on this low-pass filter, the sensitivity to noises of the reference voltage VREF is weakened to reduce the variation.

Figure 23:
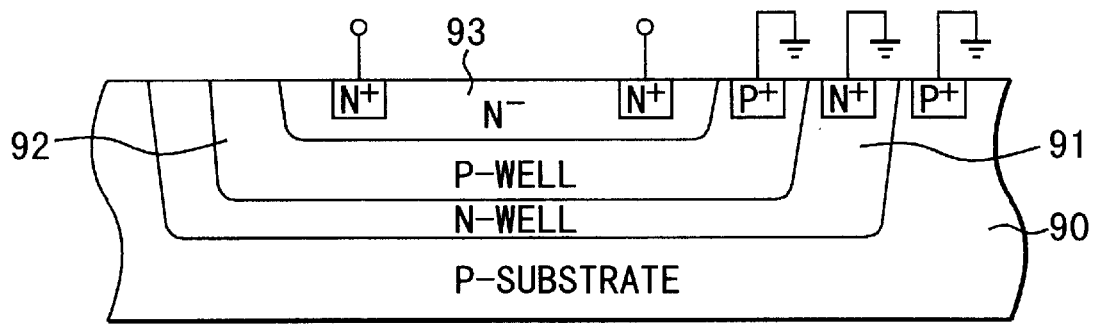
FIG. 23 is a schematic diagram showing the structure of the resistor used in the low-pass filter shown in FIG. 18.
Figure 24:
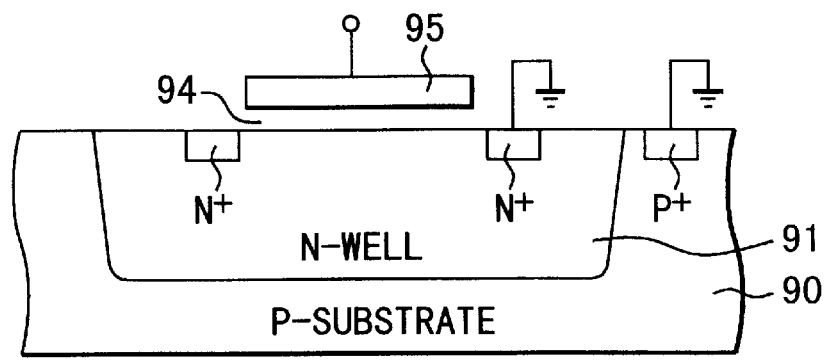
FIG. 24 is a schematic diagram showing the structure of the capacitor used in the low-pass filter shown in FIG. 18.

FIGS. 23 and 24 symbolically show sectional views of the resistor and capacitor when the low-pass filter shown in FIG. 22 is formed on a semiconductor substrate.

FIG. 23 shows the resistor RO. Referring to FIG. 23, an n-type well 91 is formed in the surface of a p-type substrate 90, a p-type well 92 is formed in an n-type well 91, thus constituting a so-called double well structure. In the surface of the p-type well 92, there is formed an $n^-$ region 93 in which an n-type impurity thinly exists. This $n^-$ region is formed in, e.g. a diffused layer region in which, e.g. an element isolation insulator film is not formed. In the n-region 93, two $n^+$ regions are formed apart from each other. These two $n^+$ regions are connected through contact holes to, e.g. aluminum wiring. The portion of the $n^-$ region which lies between the two $n^+$ regions functions as the resistor RO.

Further, the p-type substrate 90, the n-type well 91 and the p-type well 92 in the vicinity of the $n^-$ region 93 which becomes a resistor are all grounded. By coupling the resistor RO to the earth potential in this way, the variation of the power source voltage dedicated to the band gap reference circuit is released to the earth potential, so that the earth potential is made to vary in phase with the power source voltage thereof, whereby the resistance against noises of the external power source voltage can be enhanced.

FIG. 24 shows the capacitor CO. In the surface of a p-type substrate 90, an n-type well 91 is formed, and, on the surface of the n-type well, an electrode 95 is provided through, e.g. a gate insulator film 94. The n-type well 92 is grounded. The capacitor is composed of the electrode 95, the insulator film 94 and the n-type well 91. The p-type substrate 90 is grounded.

Figure 25:
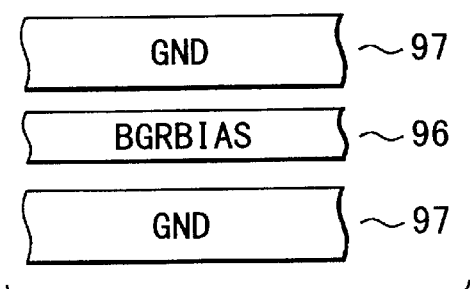
FIG. 25 is a schematic diagram showing the first wiring pattern used in the differential amplifier according to the present invention.

FIG. 25 is a top plan view of the wiring pattern in, e.g. a band gap reference circuit. Above and beneath a wiring 96 to which, for instance, the voltage BGRBIAS is fed, a ground wire 97 is provided.

Figure 26:
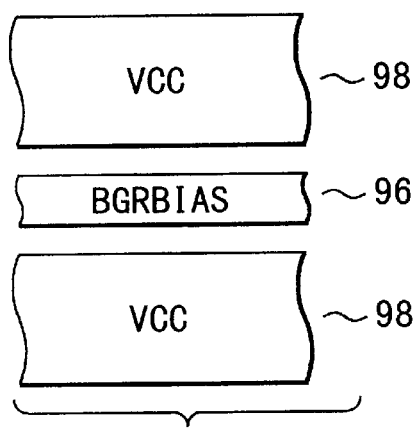
FIG. 26 is a schematic diagram showing a conventional wiring pattern.

If, as shown in FIG. 26, on at least one of the upper or lower sides of the wiring 96 to which the voltage BGRBIAS is fed, a power source line 98 is provided, then the variation of the power voltage Vcc is superimposed on the voltage BGHRBIAS since the wiring 96 and the power source line 98 are coupled to each other. As a result, the output voltage VREF is varied.

In contrast, if, above and beneath the wiring 96, ground wires 97 are provided as shown in FIG. 25, then it is ensured that the variation of the power source voltage Vcc is prevented from being superimposed on the voltage BGRBIAS as a noise; and thus, the output voltage VREF can be controlled with high accuracy.

Figure 27:
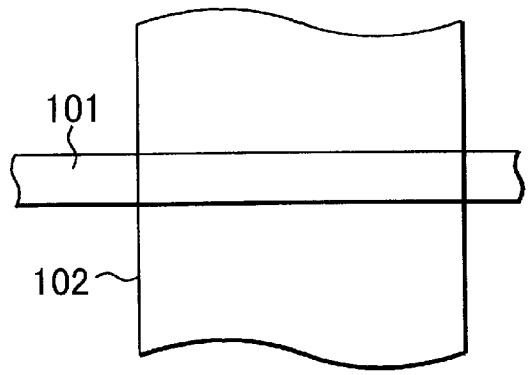
FIG. 27 is a schematic diagram showing a further conventional wiring pattern.

FIG. 27 shows an example of the wiring pattern on the band gap reference circuit. A wiring 101 is a first-layer aluminum wiring to which, for instance, the voltage BGRBIAS is fed. A wiring 102 is a second-layer aluminum wiring, to which the power source voltage Vcc is applied. The power source wiring 102 has a large width and is provided on the wiring 102 in a state perpendicularly intersecting the wiring 101.

In the case of a wiring pattern as shown in FIG. 27, a variation is produced in the output voltage VREF due to the variation of the power source voltage Vcc as in the case of the pattern shown in FIG. 26.

Figure 28:
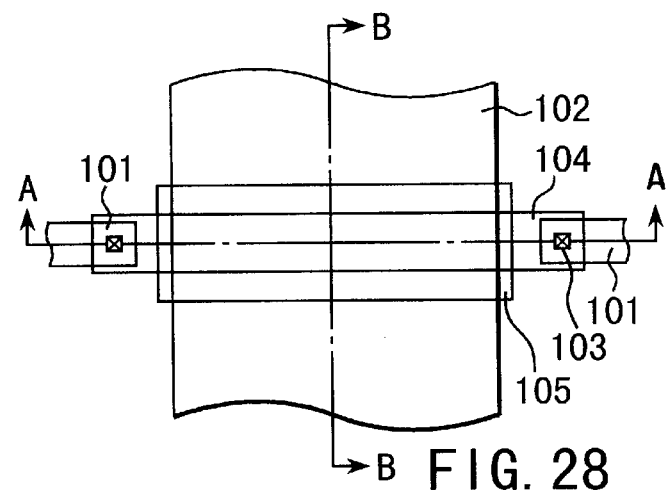
FIG. 28 is a schematic diagram showing the second wiring pattern used in the differential amplifier according to the present invention.
Figure 29A:
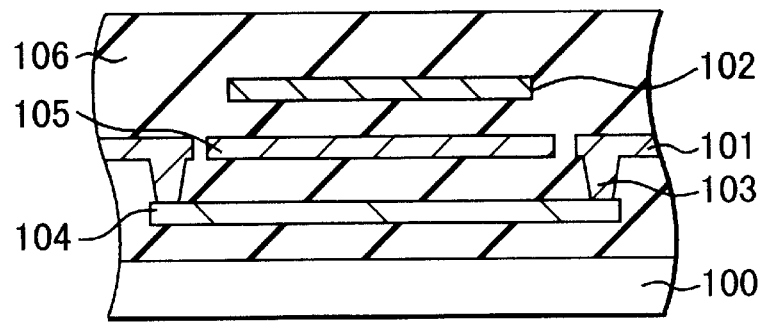
FIG. 29A is a sectional view taken along the line A—A and seen in the direction indicated by arrows in FIG. 28.
Figure 29B:
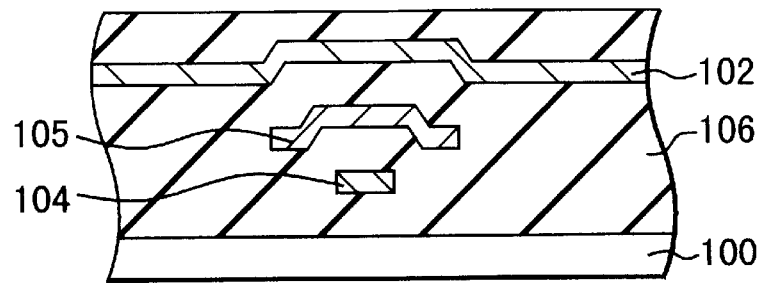
FIG. 29B is a sectional view taken along the line B—B and seen in the direction indicated by arrows in FIG. 28.

Due to this, in the band gap reference circuit according to this invention, a wiring pattern as shown in FIG. 28 and FIG. 29A and FIG. 29B are employed. FIG. 28 shows a wiring pattern diagram, and FIG. 29A and FIG. 29B are sectional views taken along the line A—A and the line B—B and seen in the directions indicated by arrows in FIG. 28, respectively.

The wiring 101 comprising the first-layer aluminum wiring applied with voltage BGRBIAS and the like is not provided beneath the power source wiring 102 comprising the second-layer aluminum wiring. Beneath the power source wiring 102, a polycrystalline silicon wiring 104 is provided, and, through a contact opening 103, the wiring 101 is connected to this polycrystalline silicon wiring 104. Further, between the polycrystalline silicon wiring 104 and the power source wiring 102, a first-layer aluminum wiring 105 is provided so as to cover the polycrystalline silicon wiring 104. To this wiring 105, the earth potential GND is fed. The reference numeral 100 in FIG. 27 denotes a semiconductor substrate, and numeral 106 denotes a insulator film.

In this case, the signal transmitted through the aluminum wiring 101 and the polycrystalline silicon wiring 104 is shielded by the grounded aluminum wiring 105 from the power source wiring 102, so that the signal can be prevented from being subjected to the variation of the power source voltage Vcc.

Further, the wiring pattern shown in FIG. 26 or FIG. 28 can be actually used for every wiring in the band gap reference circuit such as, e.g. the wiring connected to the source, drain or gate of each of the n-channel MOS transistors or the p-channel MOS transistors constituting the differential amplifier and the load transistor pair or the p-channel MOS transistor 71 which is output stage, the wiring connected to one end or the other end of each of the resistors 72, 74, 75, the wiring connected to the anode or cathode of each of the diodes 73, 76, or any of those wirings—of the wiring group consisting of the wirings connecting the component elements of the constant-current source to each other—which are not fed with the power source voltage and are not grounded. In particular, if the above-mentioned wiring pattern is applied for the wirings to which the voltage BGRBIAS is fed and the wirings to which the output voltage VREF is fed, the above-mentioned effects are further enhanced.

Figure 30:
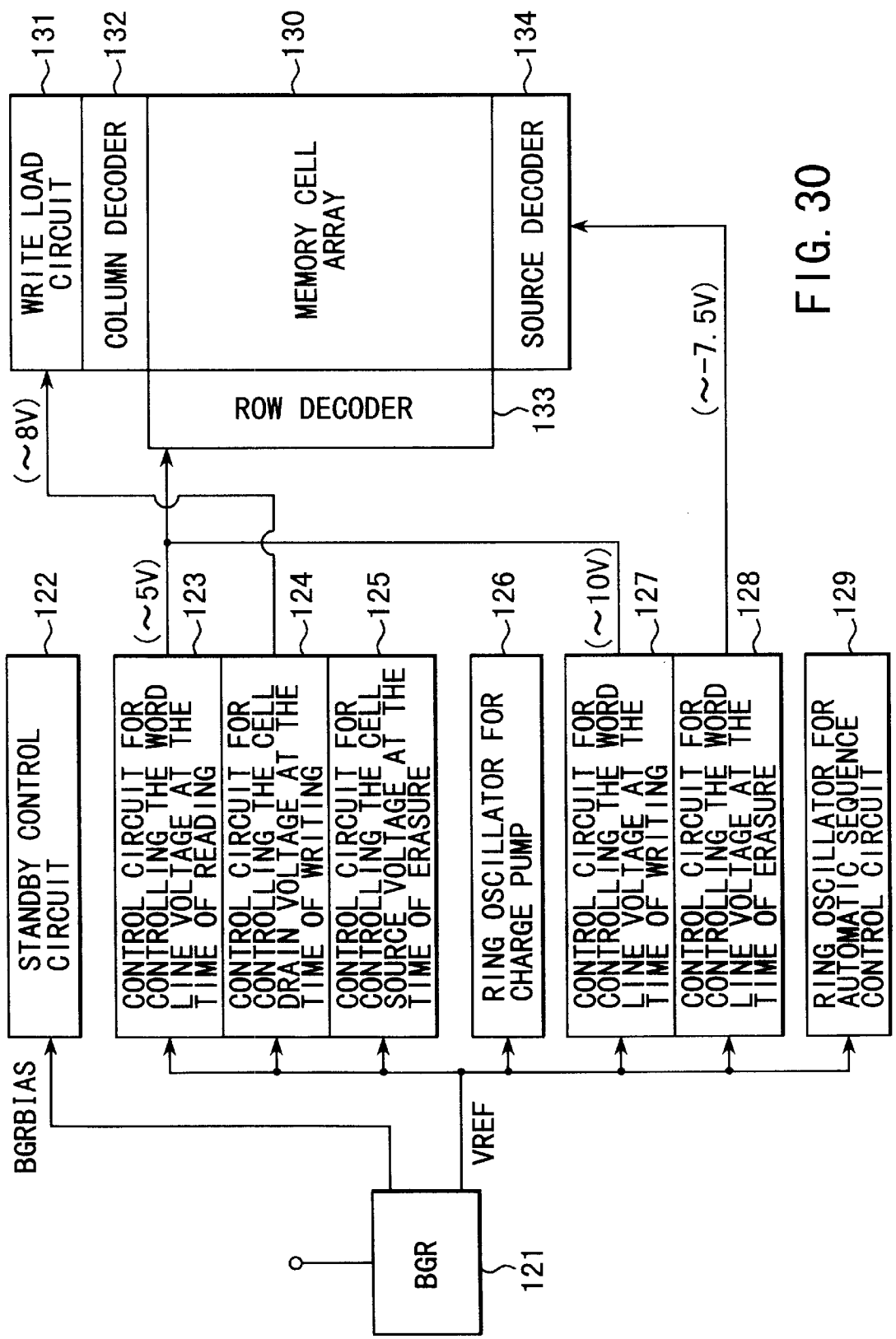
FIG. 30 is a block diagram showing a non-volatile semiconductor memory device having the band gap reference circuit according to the present invention.

FIG. 30 shows an example of the structure of a non-volatile semiconductor memory device including the band gap reference circuit according to the present invention.

A band gap reference circuit 121 produces and outputs the voltage BGRBIAS of, e.g. about 0.5 V and the reference voltage VREF of, e.g. about 1.25 V.

The voltage BGRBIAS is fed to, e.g. a standby control circuit 122. The reference voltage VREF is fed to, e.g. a control circuit for controlling the word line voltage at the time of reading 123, a control circuit 124 for controlling the cell drain voltage at the time of writing, a control circuit 125 for controlling the cell source voltage at the time of erasure, a ring oscillator 126 for a charge pump, a control circuit 127 for controlling the word line voltage at the time of writing, a control circuit 128 for controlling the word line voltage at the time of erasure, and a ring oscillator 129 for an automatic sequence control circuit.

The standby control circuit 122 is a circuit which functions to allow an internally boosted voltage to be always maintained constant and operates with a low current consumption.

The control circuit 123 for controlling the word line voltage at the time of reading is a circuit which produces a reading word-line voltage of e.g. 5 V, at the time of reading, on the basis of the reference voltage VREF and feeds the thus produced voltage to a selected word line in a memory cell array 130 through a row decoder 133.

The control circuit 124 for controlling the cell drain voltage at the time of writing is a circuit which produces a writing cell-drain voltage of, e.g. 8 V on the basis of the reference voltage VRE at the time of writing and feeds the thus produced voltage to the drain of a memory cell through a writing load circuit 131 and a column decoder 132.

The control circuit 125 for controlling the cell source voltage at the time of erasure is a circuit which process a voltage to be fed to the source of a memory cell, at the time of erasure, on the basis of the reference voltage VREF.

The ring oscillator 126 for charge pump produces a clock signal to be fed to a booster circuit (not shown). The ring oscillator 126 compares a potential a predetermine number of times as high as the reference voltage VREF with the output voltage from the booster circuit and generates a clock signal in accordance with the result of the comparison thus made or stops the clock pulse generation.

The control circuit 127 for controlling g the word line voltage at the time of writing is a circuit which produces a word line voltage of, e.g. 10 V on the basis of the reference voltage VREF at the time of writing and feeds the thus produced voltage to a selected word line in the memory cell array 130 through the row decoder 133.

The control circuit 128 for controlling the word line voltage at the time of erasure is a circuit which produces a word line voltage of, e.g. −7.5 V for erasure on the basis of the reference voltage VREF and feeds the thus produced voltage to the source of a cell in the memory cell array 130 through a source decoder 134.

The ring oscillator 126 for auto-logic is a circuit which determines the basic cyclic period at which the program sequence within the chip proceeds when the JEDEC standard command control is employed.

Figure 31:
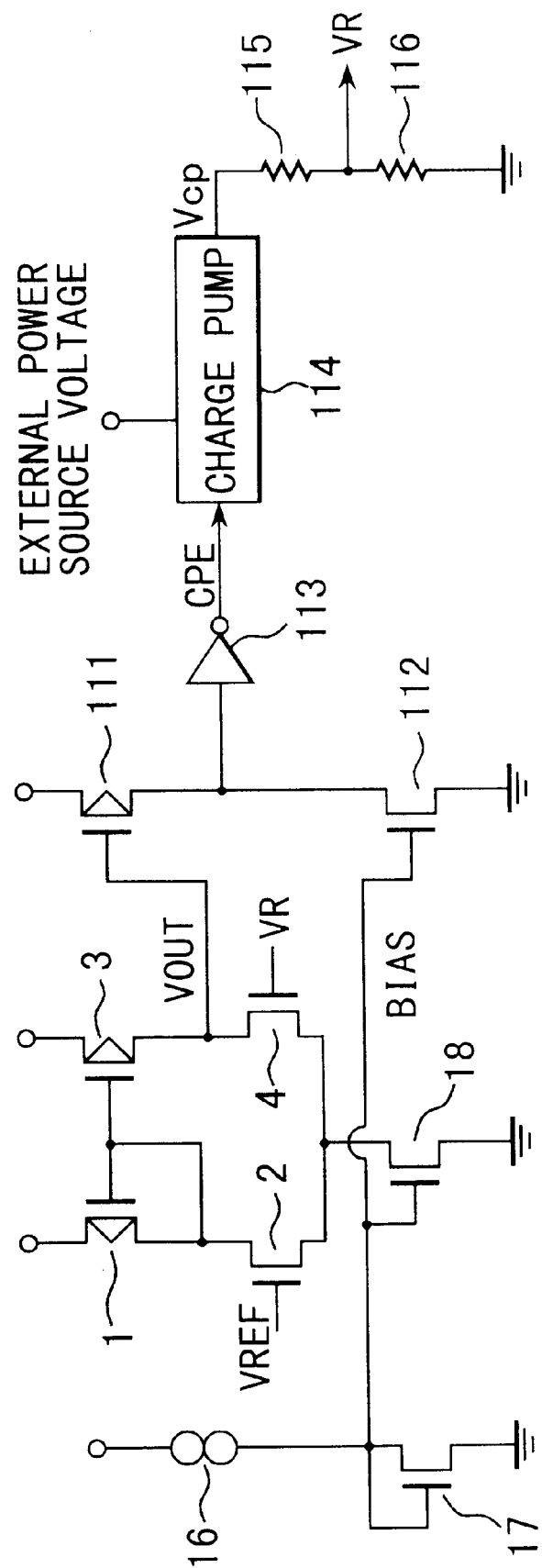
FIG. 31 is a circuit diagram showing an eighteenth embodiment of the differential amplifier according to the present invention.

FIG. 31 shows an eighteenth embodiment of the present invention.

This embodiment pertains to the case where the differential amplifier according to the foregoing embodiments is applied to a booster circuit which has a boosted potential detecting function. In the circuit shown in FIG. 31, the differential amplifier shown in FIG. 6 is used.

Referring to the differential amplifier shown in FIG. 6, the reference voltage VREF is fed as the first input voltage VIN1. This reference voltage VREF is produced by a band gap reference circuit as shown in, e.g. FIG. 15. The output voltage VOUT from the differential amplifier is fed to the gate of a p-channel MOS transistor 111. Further, the voltage BIAS is fed to the gate of an n-channel MOS transistor 112. To the source of a transistor 111, the power source voltage Vcc is fed, and the drain of the transistor 111 is connected to the drain of the transistor 112 and the input terminal of an inverter 113. The source of the transistor 112 is grounded.

The output terminal of the inverter 113 is connected to a control terminal of a charge pump 114 as booster means and outputs a charge pump enable signal CPE. The charge pump 114 is fed with the power source voltage, boosts it and outputs the thus boosted voltage Vcp. The charge pump 114 performs a boosting operation when the signal CPE indicates "enable" and stops its boosting operation when the signal CPE indicates "disenable".

The output voltage Vcp from the booster means is fed to one end of a resistor 115. The other end of the resistor 115 is connected to one end of a resistor 116, and the other end of the resistor 116 is grounded. The potential VR at the node between the resistor 115 and the resistor 116 is used as the second input voltage VIN2 of the differential amplifier.

The circuit shown in FIG. 31, whose power source is a single power source of 3.3 V for instance, is provided in such a semiconductor chip that, even in a standby state, a boosted voltage is required in the chip. In the case of such a chip, it is necessary that, in standby state, the power consumption be low, in which case the power consumption should desirably be as close to zero as possible.

In this circuit, if VR>VREF, the signal CPE becomes low in level, and the booster means becomes inactive. If VR<VREF, the signal CPE becomes high in level, and the booster means is activated. In the case where, in standby state, the output voltage Vcp of the charge pump 114 does not reach a predetermined value, the charge pump 114 operates. In the case where the output voltage Vcp is on a predetermined level, the charge pump 114 does not operate. As a result, the output voltage Vcp is maintained at the predetermined level.

In this embodiment, as the differential amplifier, the differential amplifier shown in FIG. 6 is used, so that, as in the case of the third embodiment, the power consumption of the differential amplifier can be reduced. Due thereto, in such a semiconductor device that, even in standby state, the voltage within the chip must be maintained, the standby current can be reduced, and thus, the power consumption can be decreased.

Further, with reference to this booster circuit, it is a matter of course that the differential amplifier is not limited only to the circuit according to the embodiment shown in FIG. 6, but the differential amplifier according to any of the above-mentioned embodiments other than the embodiment shown in FIG. 6 can be used. However, in case a differential amplifier of the type which is shown in FIG. 10, FIG. 11 and FIG. 12 is used, the output voltage VOUT of the differential amplifier is fed to the gate of the n-channel MOS transistor 112, and the voltage BIAS is fed to the gate of the p-channel MOS transistor 111.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor integrated circuit device provided with a differential amplifier, said differential amplifier comprising:

first and second first conductivity type MOS transistors to respective gates of which input signals are fed, said first and second transistors constituting a differential pair; and third and fourth second conductivity type MOS transistors, drains of which are connected to drains of said first and second first conductivity type MOS transistors, respectively said third and fourth transistors constituting a load transistor pair with respect to said differential pair, an output signal being delivered through one of a node between said first MOS transistor and said third MOS transistor and a node between said second MOS transistor and said fourth MOS transistor, wherein said first, second, third and fourth MOS transistors are made to operate in a weak inversion region.

2. The semiconductor integrated circuit device provided with a differential amplifier according to claim 1, wherein said third and fourth second conductivity type MOS transistors are arranged in such a manner that gates thereof are connected in common to the other one of the node between said first MOS transistor and said third MOS transistor and the node between said second MOS transistor and said fourth MOS transistor, and thus constitute a current mirror circuit.

3. A semiconductor integrated circuit device provided with a differential amplifier, said differential amplifier comprising:

a first conductivity type MOS transistor to a gate of which a first input voltage is fed;

a second first conductivity type MOS transistor to a gate of which a second input voltage is fed;

a third second conductivity type MOS transistor arranged in such a manner that, to a source thereof, a first voltage is fed, and a gate and a drain thereof are connected to a drain of said first MOS transistor; and a fourth second conductivity type MOS transistor arranged in such a manner that, to a source thereof, said first voltage is fed, and a gate thereof is connected to the drain of said first MOS transistor, while a drain thereof is connected to a drain of said second MOS transistor, and a voltage at the drain of said fourth MOS transistor is outputted as an output voltage, wherein said first and second MOS transistors and said third and fourth MOS transistors are made to operate in a weak inversion region.

4. The semiconductor integrated circuit device provided with a differential amplifier according to claim 3, further including a constant-current source arranged in such a manner that one end thereof is connected to a source of said first MOS transistor and a source of said second MOS transistor, while, to another end thereof, a second voltage is fed, and said constant-current source outputting a current with which said first and second MOS transistors and said third and fourth MOS transistors operate in the weak inversion region.

5. The semiconductor integrated circuit device provided with a differential amplifier according to claim 4, wherein said constant-current source comprises:

a first constant-current source to one end of which said second voltage is fed;

a fifth second conductivity type MOS transistor arranged in such a manner that, to a source thereof, said first voltage is fed, and a gate and a drain thereof are connected to another end of said first constant-current source;

a sixth second conductivity type MOS transistor arranged in such a manner that, to a source thereof, said first voltage is fed, and a gate thereof is connected to the other end of said first constant-current source;

a seventh first conductivity MOS transistor arranged in such a manner that a gate and a drain thereof are connected to a drain of said sixth MOS transistor, and, to a source thereof, said second voltage is fed; and an eighth first conductivity type MOS transistor arranged in such a manner that a gate thereof is connected to the drain of said sixth MOS transistor, and a drain thereof is connected to the source of said first MOS transistor and the source of said second MOS transistor, and to the source thereof, said second voltage is fed.

6. The semiconductor integrated circuit device provided with a differential amplifier according to claim 4, wherein said constant-current source comprises:
   a first constant-current source to one end of which said first voltage is fed;
   a fifth first conductivity type MOS transistor arranged in such a manner that a gate and drain thereof are connected to another end of said first constant-current source, and to a source thereof, said second voltage is fed; and
   a sixth first conductivity type MOS transistor arranged in such a manner that a gate thereof is connected to the other end of said first constant-current source, a drain thereof is connected to the source of said first MOS transistor and the source of said second MOS transistor, and to source thereof, said second voltage is fed.

7. The semiconductor integrated circuit device provided with a differential amplifier according to claim 5, wherein said first constant-current source comprises:
   a ninth second conductivity type MOS transistor arranged in such a manner that, to a source thereof, said first voltage is fed, and a gate thereof is connected to the drain of said fifth MOS transistor;
   a tenth first conductivity type MOS transistor arranged in such a manner that a gate and a drain thereof are connected to a drain of said ninth MOS transistor;
   a diode arranged in such a manner that an anode thereof is connected to a source of said tenth MOS transistor, while to a cathode thereof, said second voltage is fed;
   an eleventh first conductivity type MOS transistor arranged in such a manner that a gate thereof is connected to the gate of said tenth MOS transistor, and a drain thereof is connected to the drain of said fifth MOS transistor; and
   a resistor arranged in such a manner that one end thereof is connected to a source of said eleventh MOS transistor, and, to another end thereof, said second voltage is fed.

8. The semiconductor integrated circuit device provided with a differential amplifier according to claim 4, wherein said constant-current source comprises:
   a fifth second conductivity type MOS transistor to a source of which said first voltage is fed;
   a sixth first conductivity type MOS transistor a gate and a drain of which are connected to a drain of said fifth MOS transistor;
   a diode arranged in such a manner that an anode thereof is connected to a source of said sixth MOS transistor, and to a cathode thereof, said second voltage is fed;
   a seventh second conductivity type MOS transistor arranged in such a manner that, to a source thereof, said first voltage is fed, and a gate and a drain thereof are connected to a gate of said fifth MOS transistor;
   an eighth first conductivity type MOS transistor arranged in such a manner that a drain thereof is connected to the drain of said seventh MOS transistor, and a gate of said eighth MOS transistor is connected to the gate of said sixth MOS transistor;
   a resistor arranged in such a manner that one end thereof is connected to a source of said eighth MOS transistor, and, to another end thereof, said second voltage is fed; and
   a ninth first conductivity type transistor arranged in such a manner that a gate thereof is connected to the gate of said eighth MOS transistor, a drain thereof is connected to the source of said first MOS transistor and the source of said second MOS transistor, and, to a source thereof, said second voltage is fed.

9. The semiconductor integrated circuit device provided with a differential amplifier according to claim 4, wherein said constant-current source comprises:
   a fifth second conductivity type MOS transistor to a source of which said first voltage is fed;
   a sixth first conductivity type MOS transistor a gate and a drain of which are connected to a drain of said fifth MOS transistor;
   a seventh first conductivity type MOS transistor arranged in such a manner that a gate and drain thereof are connected to a source of said sixth MOS transistor, and, to a source thereof, said second voltage is fed;
   an eighth second conductivity type MOS transistor arranged in such a manner that a gate and a drain thereof are connected to the source of said fifth MOS transistor, and, to a source thereof, said first voltage is fed;
   a ninth first conductivity type MOS transistor arranged in such a manner that a drain thereof is connected to the drain of said eighth MOS transistor, and a gate thereof is connected to the gate of said sixth MOS transistor;
   a resistor arranged in such a manner that one end thereof is connected to a source of said ninth MOS transistor, and, to another end thereof, said second voltage is fed;
   a tenth second conductivity type MOS transistor arranged in such a manner that, to a source thereof, said first voltage is fed, and a gate thereof is connected to the drain of said eighth MOS transistor;
   an eleventh first conductivity type MOS transistor arranged in such a manner that a gate and a drain thereof are connected to a drain of said tenth MOS transistor, and, to a source thereof, said second voltage is fed; and
   a twelfth first conductivity type MOS transistor arranged in such a manner that a gate thereof is connected to the drain of said eleventh MOS transistor, a drain thereof is connected to the source of said first MOS transistor and the source of said second MOS transistor, and to a source thereof, said second voltage is fed.

10. A semiconductor integrated circuit device provided with a differential amplifier, said differential amplifier comprising:
   first and second first conductivity type MOS transistors to respective gates of which input signals are fed, said first and second MOS transistors constituting a differential pair;
   third and fourth second conductivity type MOS transistors drains of which are connected to drains of said first and second first conductivity type MOS transistors, respectively, said third and fourth MOS transistors constituting a load transistor pair with respect to said differential pair;
   wherein, through one of a node between said first MOS transistor and said third MOS transistor and a node between said second MOS transistor and said fourth MOS transistor, an output signal is outputted; and
   wherein at least one of the pair of said first and second MOS transistors, and the pair of said third and fourth MOS transistors, is comprised of intrinsic MOS transistors.

11. The semiconductor integrated circuit device provided with a differential amplifier according to claim 10, wherein said third and fourth second conductivity type MOS transistors are arranged in such a manner that gates thereof are connected in common to the other one of the node between said first MOS transistor and said third MOS transistor and the node between said second MOS transistor and said fourth MOS transistor, and thus constitute a current mirror circuit.

12. The semiconductor integrated circuit device provided with a differential amplifier according to claim 10, wherein the pair of said first and second MOS transistors are comprised of intrinsic MOS transistors.

13. The semiconductor integrated circuit device provided with a differential amplifier according to claim 4, wherein said constant-current source comprises:

a fifth first conductivity type MOS transistor to a source of which said second voltage is fed;

a sixth second conductivity type MOS transistor a gate and a drain of which are connected to a drain of said fifth MOS transistor;

a diode arranged in such a manner that an anode thereof is connected to a source of said sixth MOS transistor, while to a cathode thereof, said first voltage is fed;

a seventh first conductivity type MOS transistor arranged in such a manner that, to a source thereof, said second voltage is fed, and a gate and a drain thereof are connected to a gate of said fifth MOS transistor;

an eighth second conductivity type MOS transistor arranged in such a manner that a drain thereof is connected to the drain of said seventh MOS transistor, and a gate thereof is connected to the gate of said sixth MOS transistor;

a resistor arranged in such a manner that one end thereof is connected to a source of said eighth MOS transistor, and to another end thereof, said first voltage is fed; and a ninth first conductivity type MOS transistor arranged in such a manner that, to a source thereof, said second voltage is fed, a gate thereof is connected to the drain of said seventh MOS transistor, and a drain thereof is connected to the source of said first MOS transistor and the source of said second MOS transistor.

14. The semiconductor integrated circuit device provided with a differential amplifier according to claim 10, further including a constant-current source comprising:

a fifth first conductivity type MOS transistor to a source of which a first voltage is fed;

a sixth second conductivity type MOS transistor a gate and a drain of which are connected to a drain of said fifth MOS transistor;

a diode arranged in such a manner that an anode thereof is connected to a source of said sixth MOS transistor, while to a cathode thereof, a second voltage is fed;

a seventh first conductivity type MOS transistor arranged in such a manner that, to a source thereof, said first voltage is fed, and a gate and a drain thereof are connected to a gate of said fifth MOS transistor;

an eighth second conductivity type MOS transistor arranged in such a manner that a drain thereof is connected to the drain of said seventh MOS transistor, and a gate thereof is connected to the gate of said sixth MOS transistor;

a resistor arranged in such a manner that one end thereof is connected to a source of said eighth MOS transistor, and to another end thereof, said second voltage is fed; and a ninth first conductivity type MOS transistor arranged in such a manner that, to a source thereof, said first voltage is fed, a gate thereof is connected to the drain of said seventh MOS transistor, and a drain thereof is connected to a source of said first MOS transistor and a source of said second MOS transistor.

15. The semiconductor integrated circuit device provided with a differential amplifier according to claim 1, further comprising:

a first resistor arranged in such a manner that the output signal of said differential amplifier is fed to one end thereof, and a voltage at said one end is outputted as a reference voltage;

a first diode arranged in such a manner that an anode thereof is connected to another end of said first resistor, while to a cathode thereof, a predetermined voltage is fed, and a voltage at said anode is fed as said input signal to the gate of one of said first and second MOS transistors;

a second resistor one end of which is connected to the one end of said first resistor;

a third resistor arranged in such a manner that one end thereof is connected to another end of said second resistor, and a voltage at said one end is fed as said input signal to the gate of the other one of said first and second MOS transistors; and a second diode arranged in such a manner that an anode thereof is connected to another end of said third resistor, while to a cathode thereof, said predetermined voltage is fed; wherein said device constitutes a reference voltage generation circuit.

16. The semiconductor integrated circuit device provided with a differential amplifier according to claim 10, further comprising:

a first resistor arranged in such a manner that the output signal of said differential amplifier is fed to one end thereof, and a voltage at said one end is outputted as a reference voltage;

a first diode arranged in such a manner that an anode thereof is connected to another end of said first resistor, while to a cathode thereof, a predetermined voltage is fed, and a voltage at said anode is fed as said input signal to the gate of one of said first and second MOS transistors;

a second resistor one end of which is connected to the one end of said first resistor;

a third resistor arranged in such a manner that one end thereof is connected to another end of said second resistor, and a voltage at said one end is fed as said input signal to the gate of the other one of said first and second MOS transistors;

a second diode arranged in such a manner that an anode thereof is connected to another end of said third resistor, while a cathode thereof, said predetermined voltage is fed; wherein said device constitutes a reference voltage generation circuit.

17. The semiconductor integrated circuit device provided with a differential amplifier according to claim 15, wherein the output signal of said differential amplifier is fed through a drain of a fifth second conductivity MOS transistor having a gate connected to the one of the node between said first MOS transistor and said third MOS transistor and the node between said second MOS transistor and said fourth MOS transistor, and to a source thereof, a first voltage applied to a source of said third MOS transistor and a source of said fourth MOS transistor is fed.

18. The semiconductor integrated circuit device provided with a differential amplifier according to claim 16, wherein the output signal of said differential amplifier is fed through a drain of a fifth first conductivity MOS transistor which a gate thereof is connected to the one of the node between said first MOS transistor and said third MOS transistor and the node between said second MOS transistor and said fourth MOS transistor, and to a source thereof, a first voltage applied to a source of said third MOS transistor and a source of said fourth MOS transistor is fed.

19. The reference voltage generation circuit according to claim 15, wherein said first and second MOS transistors are comprised of intrinsic MOS transistors.

20. The semiconductor integrated circuit device provided with a differential amplifier according to claim 14, further comprising:
- a first resistor arranged in such a manner that the output signal of said differential amplifier is fed to one end thereof, and a voltage at said one end is outputted as a reference voltage;
- a first diode arranged in such a manner that an anode thereof is connected to the other end of said first resistor, while to a cathode thereof, a predetermined voltage is fed, and a voltage at said anode is fed as said input signal to the gate of one of said first and second MOS transistors;
- a second resistor one end of which is connected to the one end of said first resistor;
- a third resistor arranged in such a manner that one end thereof is connected to another end of said second resistor, and a voltage at said one end is fed as said input signal to the gate of the other one of said first and second MOS transistors;
- a second diode arranged in such a manner that an anode thereof is connected to another end of said third resistor, while to a cathode thereof, said predetermined voltage is fed; and
- wherein said fifth, sixth, seventh, eighth and ninth MOS transistors are comprised of the intrinsic MOS transistors, and wherein said device constitutes a reference voltage generation circuit.

21. The semiconductor integrated circuit device provided with a differential amplifier according to claim 15, wherein a power supply voltage is fed through a low-pass filter.

22. The semiconductor integrated circuit device provided with a differential amplifier according to claim 20, wherein said low-pass filter comprises:
- a fourth resistor which one end thereof is connected to an input terminal and another end thereof is connected to an output terminal; and
- a capacitor which one end thereof is connected to said output terminal and another end thereof is grounded.

23. The semiconductor integrated circuit device provided with a differential amplifier according to claim 22, wherein said fourth resistor is provided in a region of a second conductivity type which is formed on a surface of a well of a first conductivity type, said first-conductivity type well is formed in a second-conductivity type well formed in said first-conductivity type substrate, and said first-conductivity type well, said second-conductivity type well and said first-conductivity type substrate are grounded.

24. The semiconductor integrated circuit device provided with a differential amplifier according to claim 22, wherein said capacitor comprises:
- a well grounded;
- a gate insulating layer formed on a surface of said well; and
- an electrode formed on a surface of said gate insulating layer.

25. The semiconductor integrated circuit device provided with a differential amplifier according to claim 15, wherein, among a wiring group consisting of wirings connected to sources, drains or gates of said respective MOS transistors, wirings connected to the one end or the other end of each of said respective resistors, wirings connected to the anodes or cathodes of said respective diodes, or wirings which connect elements constituting a constant-current source with each other, at both sides of at least part of a wiring which is not fed with a power source voltage and not grounded, there are provided wirings which are grounded.

26. The semiconductor integrated circuit device provided with a differential amplifier according to claim 15, wherein, among a wiring group consisting of wirings connected to sources, drains or gates of said respective MOS transistors, wirings connected to the one end or the other end of each of said respective resistors, wirings connected to the anodes or cathodes of said respective diodes, or wiring which connect elements constituting a constant-current source with each other, at a location where a wiring which is not fed with a power source voltage and not grounded, intersects a power source wiring which is fed with the power source voltage, a wiring which is grounded is provided between said power source wiring and said intersecting wiring.

27. The semiconductor integrated circuit device provided with a differential amplifier, said differential amplifier according to claim 1, further comprising;
- a booster circuit to which a booster circuit activating signal is fed, said booster circuit outputting a boosted voltage;
- a voltage dropping circuit to which said boosted voltage is fed, said voltage dropping circuit outputting a voltage obtained by dropping said boosted voltage at a fixed ratio; and
- a control circuit which generates said booster circuit activating signal in response to the output signal from said differential amplifier.

28. The semiconductor integrated circuit device provided with a differential amplifier, according to claim 15, further comprising:
- a memory cell array comprising a plurality of memory cells arranged in a matrix;
- wherein a voltage other than an external power source voltage fed to each node of said memory cells is generated on the basis of an output voltage from said reference voltage generation circuit.

* * * * *